US012727174B2

(12) United States Patent
Kwon et al.

(10) Patent No.: US 12,727,174 B2
(45) Date of Patent: Sep. 1, 2026

(54) THREE-DIMENSIONAL SEMICONDUCTOR MEMORY DEVICE WITH DUMMY PLUG AND ELECTRONIC SYSTEM INCLUDING THE SAME

(71) Applicant: Samsung Electronics Co., Ltd., Suwon-si (KR)

(72) Inventors: Joonyoung Kwon, Suwon-si (KR); Jiyoung Kim, Suwon-si (KR); Woosung Yang, Suwon-si (KR); Sukkang Sung, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 412 days.

(21) Appl. No.: 18/187,803

(22) Filed: Mar. 22, 2023

(65) Prior Publication Data

US 2024/0114704 A1 Apr. 4, 2024

(30) Foreign Application Priority Data

Sep. 30, 2022 (KR) ........................ 10-2022-0125162

(51) Int. Cl.

*H10B 80/00* (2026.01)
*H10B 43/27* (2023.01)
*H10B 43/40* (2023.01)

(52) U.S. Cl.

CPC ............. *H10B 80/00* (2023.02); *H10B 43/27* (2023.02); *H10B 43/40* (2023.02)

(58) Field of Classification Search

CPC ........ H10B 53/00; H10B 53/10; H10B 53/20; H10B 53/30; H10B 53/40; H10B 53/50;
(Continued)

(56) References Cited

U.S. PATENT DOCUMENTS 11,024,600 B2 * 6/2021 Liu ........................ H01L 24/80
11,062,966 B2 7/2021 Lee et al.
(Continued)

FOREIGN PATENT DOCUMENTS

KR 20190115644 A 10/2019
KR 20220081167 A 6/2022
KR 20220115726 A 8/2022

*Primary Examiner* — William B Partridge
*Assistant Examiner* — Gustavo G Ramallo
(74) *Attorney, Agent, or Firm* — Fish & Richardson P.C.

(57) ABSTRACT

A three-dimensional semiconductor memory device may include a first substrate, a peripheral circuit structure on the first substrate, the peripheral circuit structure including first bonding pads in an upper portion of the peripheral circuit structure, and a cell array structure on the peripheral circuit structure. The cell array structure may include a second substrate, a stack interposed between the peripheral circuit structure and the second substrate, a first insulating layer enclosing the stack, a dummy plug penetrating the first insulating layer, a second insulating layer on the dummy plug, and second bonding pads interposed between the stack and the peripheral circuit structure and connected to the dummy plug. The first bonding pads may contact the second bonding pads, and the dummy plug may be electrically connected to the first bonding pads and the second bonding pads. A top surface of the dummy plug may contact the second insulating layer.

20 Claims, 22 Drawing Sheets

(58) Field of Classification Search
CPC ........ H10B 41/00; H10B 41/10; H10B 41/20; H10B 41/23; H10B 41/27; H10B 41/30; H10B 41/35; H10B 41/40–44; H10B 41/46–50; H10B 41/60; H10B 41/70; H10B 43/00; H10B 43/10; H10B 43/20; H10B 43/23; H10B 43/27; H10B 43/30; H10B 43/35; H10B 43/40; H10B 43/50; H10B 51/00; H10B 51/10; H10B 51/20; H10B 51/30; H10B 51/40; H10B 51/50
See application file for complete search history.

(56) References Cited

U.S. PATENT DOCUMENTS

| | | | | |
|---|---|---|---|---|
| 11,114,178 | B1 | 9/2021 | Eliash et al. | |
| 11,195,587 | B2 | 12/2021 | Son et al. | |
| 2016/0163635 | A1* | 6/2016 | Yun | H01L 23/528 257/659 |
| 2019/0172838 | A1* | 6/2019 | Jo | H10B 43/35 |
| 2019/0333931 | A1* | 10/2019 | Jung | H01L 21/28525 |
| 2021/0066282 | A1* | 3/2021 | Kim | H10D 88/00 |
| 2021/0074596 | A1 | 3/2021 | Kim et al. | |
| 2022/0051738 | A1* | 2/2022 | Lee | G11C 29/4401 |
| 2022/0077129 | A1* | 3/2022 | Sung | H10B 43/27 |
| 2022/0108926 | A1 | 4/2022 | Pachamuthu et al. | |
| 2022/0130849 | A1* | 4/2022 | Kwon | G11C 16/08 |
| 2022/0310801 | A1* | 9/2022 | Song | H10D 64/111 |

* cited by examiner

SC
ST1
ST2
80
100
SCP1
SCP2
ILDa
ELa
ELa
ILDa
ILDb
ELb
ELb
ILDb
CH2
50
BLCP
BL
40
30
11
10
I'
ST1
ST2
ST
CAR
A
VS1
CH1
EXR
101p
VS2
41
43
33
31
ELp
PTR
27
21
23
29
25
CCP
CL1
45
35
IOP
PCC
DPLG
TCP
60
CH
DSP
VSP
VI
PAD
CL4
CL3
CL2
PS
I
D1
D2
D3
CS

SC
ST1
ST2
80
100
SCP1
SCP2
ILDa
ELa
ILDb
ELb
CH2
50
BLCP
BL
43
40
30
11
10
I'
ST
CAR
VS1
CH1
EXR
101p
VS2
41
33
31
ELp
27
21
23
29
25
PTR
CL1
CCP
45
35
IOP
PCC
DPLG
TCP
60
CH
DSP
VSP
VI
PAD
CL4
CL3
CL2
PS
I
CS
D1
D2
D3

CAR
CS
CH
CH1
CH2
SP
DSP
VSP
VI
PAD
TR
45
35
PS
D1
D2
D3
80
100
SCP1
SCP2
SC
ILDa
ELa
ST1
ST2
ST
ILDb
ELb
50
BLCP
BL
40
30
11
10
33
31
PTR
27
21
23
29
25
43
41
CPAD
90
DPLG
VS1

CAR
VS3
VS1
90
DPLG
80
100
SCP1
SCP2
SC
ILDa
ELa
ST1
ST
ILDb
ELb
ST2
SP
CH1
CH
CH2
CS
DSP
VSP
VI
PAD
CPAD
TR
50
BLCP
BL
41
43
45
35
40
PTR
PS
31
30
11
10
D3
D2
D1
25 29 23 21 27
33

THREE-DIMENSIONAL SEMICONDUCTOR MEMORY DEVICE WITH DUMMY PLUG AND ELECTRONIC SYSTEM INCLUDING THE SAME

CROSS-REFERENCE TO RELATED APPLICATIONS

This U.S. non-provisional patent application claims priority under 35 U.S.C. § 119 to Korean Patent Application No. 10-2022-0125162, filed on Sep. 30, 2022, in the Korean Intellectual Property Office, the entire contents of which are hereby incorporated by reference.

BACKGROUND

Various example embodiments relate to a three-dimensional semiconductor memory device and/or an electronic system including the same, and in particular, to a nonvolatile three-dimensional semiconductor memory device including a vertical channel structure, a method of fabricating the same, and an electronic system including the same.

A semiconductor device capable of storing a large amount of data is required as a data storage of an electronic system. Higher integration of semiconductor devices is required or desired to satisfy consumer demands or expectations for large data storing capacity, superior performance, and/or inexpensive prices. In the case of two-dimensional or planar semiconductor devices, since their integration is mainly determined by the area occupied by a unit memory cell, integration is greatly influenced by the level of a fine pattern forming technology. However, extremely expensive process equipment needed or used to increase pattern fineness may set a practical limitation on increasing integration for two-dimensional or planar semiconductor devices. Thus, three-dimensional semiconductor memory devices including three-dimensionally arranged memory cells have recently been proposed.

SUMMARY

Various example embodiments provide a three-dimensional semiconductor memory device with improved electrical and/or reliability characteristics and/or a method of reducing process cost in a process of fabricating a three-dimensional semiconductor memory device.

Alternatively or additionally, some example embodiments provide an electronic system including the three-dimensional semiconductor memory device.

According some example embodiments, a three-dimensional semiconductor memory device may include a first substrate, a peripheral circuit structure on the first substrate, the peripheral circuit structure including a plurality of first bonding pads in an upper portion of the peripheral circuit structure, and a cell array structure on the peripheral circuit structure. The cell array structure may include a second substrate, a stack interposed between the peripheral circuit structure and the second substrate, the stack including interlayer insulating layers and gate electrodes alternatingly stacked on the peripheral circuit structure, a first insulating layer enclosing the stack, a dummy plug penetrating the first insulating layer, a second insulating layer on the dummy plug, and a plurality of second bonding pads interposed between the stack and the peripheral circuit structure and connected to the dummy plug. The first bonding pads may be in contact with the second bonding pads, and the dummy plug may be electrically connected to the first bonding pads and the second bonding pads. A top surface of the dummy plug may be in contact with the second insulating layer.

Alternatively or additionally, according to some example embodiments, a three-dimensional semiconductor memory device may include a first substrate, a peripheral circuit structure on the first substrate, and a cell array structure on the peripheral circuit structure. The cell array structure may include a second substrate, a stack interposed between the peripheral circuit structure and the second substrate, the stack including interlayer insulating layers and gate electrodes alternatingly stacked on the peripheral circuit structure, a first insulating layer enclosing the stack, a second insulating layer on the first insulating layer, an input/output pad penetrating the second insulating layer, a dummy plug, a penetration contact plug, and a substrate contact plug, which penetrate the first insulating layer and are spaced apart from the stack in a first direction parallel to a top surface of the first substrate, and connection contact plugs and connection circuit interconnection lines between the dummy plug and the peripheral circuit structure and between the substrate contact plug and the peripheral circuit structure. The substrate contact plug may be in contact with the second substrate, and the input/output pad may vertically overlap with the penetration contact plug. The second insulating layer may vertically overlap the dummy plug.

According to some example embodiments, an electronic system may include a three-dimensional semiconductor memory device including a first substrate, a peripheral circuit structure on the first substrate, a cell array structure on the peripheral circuit structure, a first insulating layer covering the cell array structure, and an input/output pad provided on the first insulating layer and electrically connected to the peripheral circuit structure, and a controller, which is electrically connected to the three-dimensional semiconductor memory device through the input/output pad and is configured to control the three-dimensional semiconductor memory device. The peripheral circuit structure may include first bonding pads in an upper portion of the peripheral circuit structure, and peripheral contact plugs and peripheral circuit interconnection lines connected to the first bonding pads. The cell array structure may include a second substrate on the peripheral circuit structure, a stack interposed between the peripheral circuit structure and the second substrate, the stack including interlayer insulating layers and gate electrodes which are alternately stacked, a dummy plug spaced apart from the stack and extending in a direction perpendicular to a top surface of the first substrate, a second insulating layer on the dummy plug, connection contact plugs and connection circuit interconnection lines interposed between the peripheral circuit structure and the dummy plug, and second bonding pads in contact with the first bonding pads. A top surface of the dummy plug may be in contact with the second insulating layer, and the input/output pad may be spaced apart from the dummy plug.

BRIEF DESCRIPTION OF THE DRAWINGS

The above and other aspects and features will become more apparent by describing in detail various example embodiments thereof with reference to the attached drawings, in which.

DETAILED DESCRIPTION

Various example embodiments concepts will now be described more fully with reference to the accompanying drawings, in which some example embodiments are shown.

Figure 1:
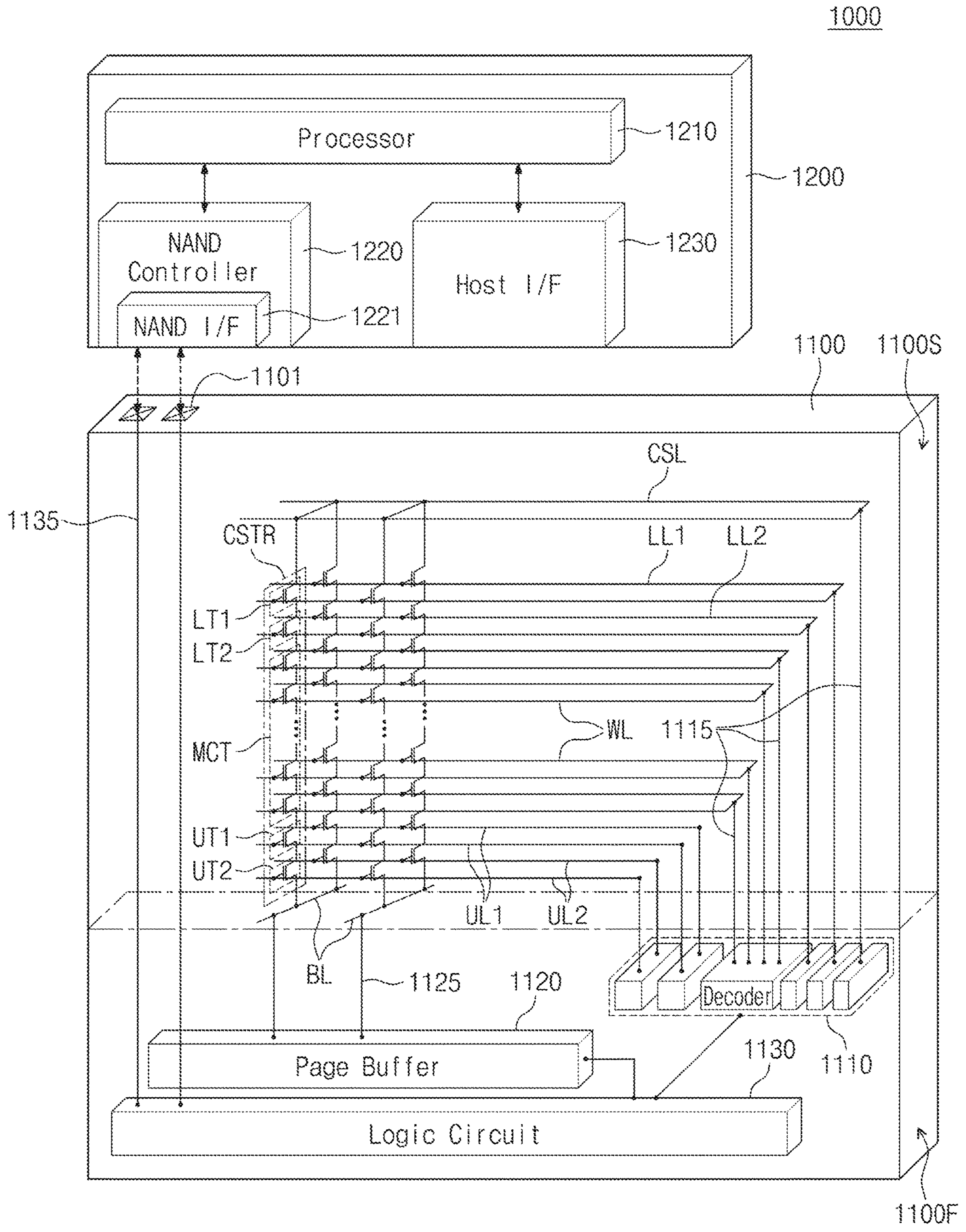
FIG. 1 is a diagram schematically illustrating an electronic system including a three-dimensional semiconductor memory device according to various example embodiments.

FIG. 1 is a diagram schematically illustrating an electronic system including a three-dimensional semiconductor memory device according to various example embodiments.

Referring to FIG. 1, an electronic system 1000 may include a three-dimensional semiconductor memory device 1100 and a controller 1200, which is electrically connected to the three-dimensional semiconductor memory device 1100. The electronic system 1000 may be or may include a storage device including one or more three-dimensional semiconductor memory devices 1100 or an electronic device including the storage device. For example, the electronic system 1000 may be or may include one or more of a solid state drive (SSD) device, a universal serial bus (USB), a computing system, a medical system, or a communication system, in which at least one three-dimensional semiconductor memory device 1100 is provided.

The three-dimensional semiconductor memory device 1100 may be or may include a nonvolatile memory device (e.g., a three-dimensional NAND FLASH memory device to be described below). The three-dimensional semiconductor memory device 1100 may include a first region 1100F and a second region 1100S on the first region 1100F. However, unlike that illustrated in the drawings, the first region 1100F may be disposed beside the second region 1100S. The first region 1100F may be or include or may correspond to a peripheral circuit region, which includes a decoder circuit 1110, a page buffer 1120, and a logic circuit 1130. The second region 1100S may be a memory cell region, which includes bit lines BL, a common source line CSL, word lines WL, first lines LL1 and LL2, second lines UL1 and UL2, and memory cell strings CSTR between the bit lines BL and the common source line CSL.

In the second region 1100S, each of the memory cell strings CSTR may include first transistors LT1 and LT2 adjacent to the common source line CSL, second transistors UT1 and UT2 adjacent to the bit lines BL, and a plurality of memory cell transistors MCT disposed between the first transistors LT1 and LT2 and the second transistors UT1 and UT2. The number of the first transistors LT1 and LT2 and/or the number of the second transistors UT1 and UT2 may be variously changed, according to embodiments, and may be the same as each other, or may be different than each other. The electrical properties of each of the first transistors LT1 and LT2 and the second transistors UT1 and UT2 may be the same as each other, or may be different from one another. The memory cell strings CSTR may be positioned between the common source line CSL and the first region 1100F.

For example, the second transistors UT1 and UT2 may include a string selection transistor, and the first transistors LT1 and LT2 may include a ground selection transistor. The first lines LL1 and LL2 may serve as gate electrodes of the first transistors LT1 and LT2. The word lines WL may serve as gate electrodes of the memory cell transistors MCT. The second lines UL1 and UL2 may serve as gate electrodes of the second transistors UT1 and UT2.

For example, the first transistors LT1 and LT2 may include a first erase control transistor LT1 and a ground selection transistor LT2, which are connected in series. Alternatively or additionally, the second transistors UT1 and UT2 may include a string selection transistor UT1 and a second erase control transistor UT2, which are connected in series. At least one of the first and second erase control transistors LT1 and UT2 may be used for an erase operation to erase data, which may be stored in the memory cell transistors MCT, using a gate-induced drain leakage (GIDL) phenomenon.

The common source line CSL, the first lines LL1 and LL2, the word lines WL, and the second lines UL1 and UL2 may be electrically connected to the decoder circuit 1110 through first interconnection lines 1115, which are extended from the first region 1100F to the second region 1100S. The bit lines BL may be electrically connected to the page buffer 1120 through second interconnection lines 1125, which are extended from the first region 1100F to the second region 1100S.

In the first region 1100F, the decoder circuit 1110 and the page buffer 1120 may be configured to perform a control operation, which is performed on at least one memory cell transistor that is selected from the memory cell transistors MCT. The decoder circuit 1110 and the page buffer 1120 may be controlled by the logic circuit 1130. The three-dimensional semiconductor memory device 1100 may communicate with the controller 1200 through an input/output pad 1101, which is electrically connected to the logic circuit 1130. The input/output pad 1101 may be electrically connected to the logic circuit 1130 through an input/output interconnection line 1135, which extends from the first region 1100F to the second region 1100S.

The controller 1200 may include a processor 1210, a NAND controller 1220, and a host interface 1230. In some example embodiments, the electronic system 1000 may include a plurality of three-dimensional semiconductor memory devices 1100, which are controlled by the controller 1200.

The processor 1210 may control overall operations of the electronic system 1000 including the controller 1200. Based on a specific firmware, the processor 1210 may execute operations of controlling the NAND controller 1220 and accessing the three-dimensional semiconductor memory device 1100. The NAND controller 1220 may include a NAND interface 1221, which is used for communication with the three-dimensional semiconductor memory device 1100. The NAND interface 1221 may be used to transmit and/or receive control commands to control the three-dimensional semiconductor memory device 1100, data to be written in or read from the memory cell transistors MCT of the three-dimensional semiconductor memory device 1100, and so forth. The host interface 1230 may be configured to allow for communication between the electronic system 1000 and an external host. If a control command is provided from an external host through the host interface 1230, the processor 1210 may control the three-dimensional semiconductor memory device 1100 in response to the control command.

Figure 2:
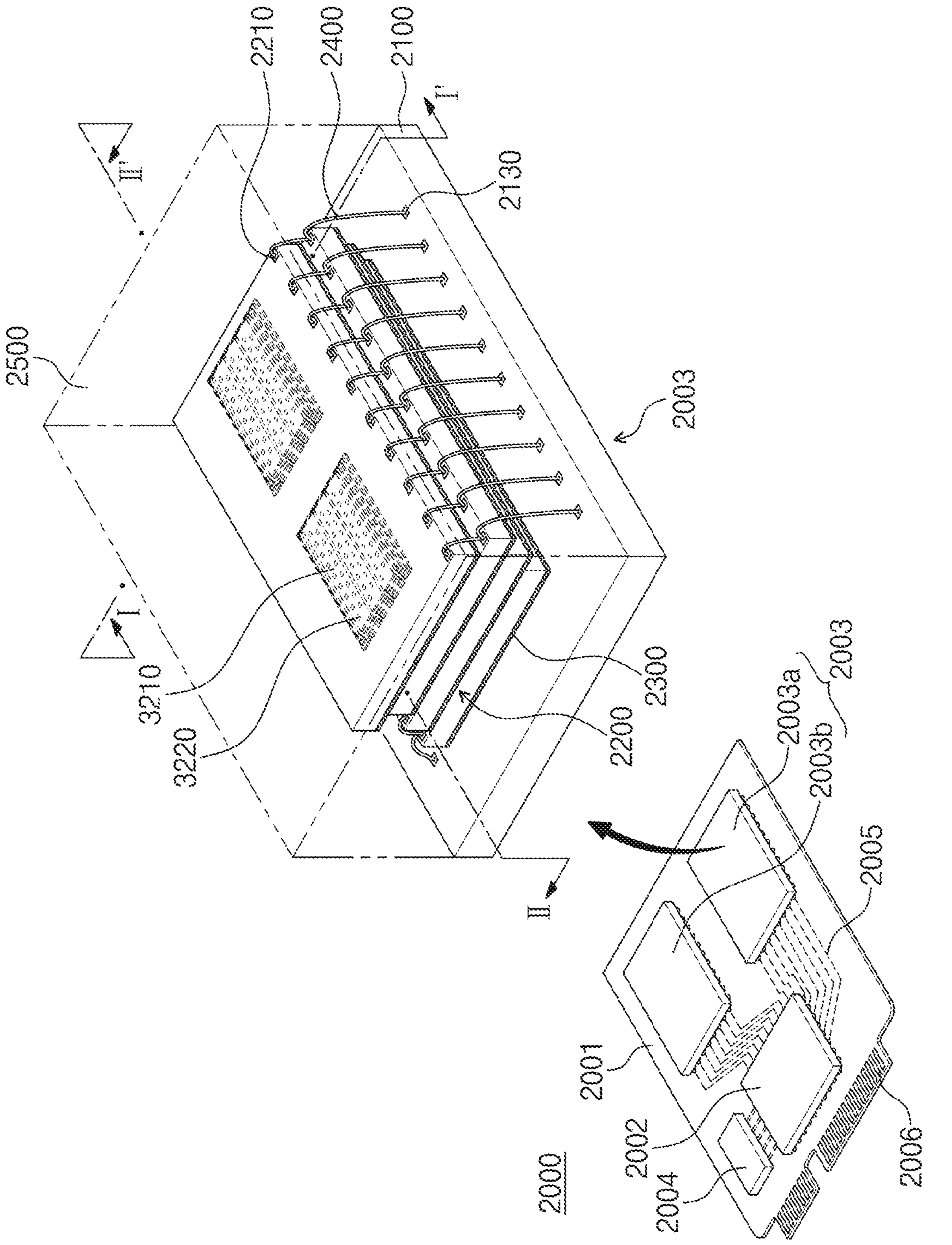
FIG. 2 is a perspective view schematically illustrating an electronic system including a three-dimensional semiconductor memory device according to various example embodiments.

FIG. 2 is a perspective view schematically illustrating an electronic system including a three-dimensional semiconductor memory device according to various example embodiments.

Referring to FIG. 2, an electronic system 2000 may include a main substrate 2001 and a controller 2002, one or more semiconductor packages 2003, and a DRAM 2004, which are mounted on the main substrate 2001. The semiconductor package 2003 and the DRAM 2004 may be connected to the controller 2002 and to each other by interconnection patterns 2005, which are provided in the main substrate 2001.

The main substrate 2001 may include a connector 2006, which includes a plurality of pins coupled to an external host. In the connector 2006, the number and/or the arrangement of the pins may be changed, for example depending on a communication interface between the electronic system 2000 and an external host. For example, the electronic system 2000 may communicate with the external host, in accordance with one of interfaces, such as one or more of universal serial bus (USB), peripheral component interconnect express (PCI-Express), serial advanced technology attachment (SATA), universal flash storage (UFS) M-PHY, or the like. In some example embodiments, the electronic system 2000 may be driven by an electric power, which is supplied from the external host through the connector 2006. The electronic system 2000 may further include a power management integrated circuit (PMIC) that is used to separately supply the electric power, which is provided from the external host, to the controller 2002 and the semiconductor package 2003.

The controller 2002 may control a writing or reading operation on the semiconductor package 2003 and may improve an operation speed of the electronic system 2000.

The DRAM 2004 may be or may include a buffer memory that is used to relieve or at least partially relieve technical difficulties caused by a difference in speed between the semiconductor package 2003, which serves as a data storage device, and an external host. In some example embodiments, the DRAM 2004 in the electronic system 2000 may serve as a cache memory and may be used as a storage space, which is used to temporarily store data during a control operation on the semiconductor package 2003. In the case where the electronic system 2000 includes the DRAM 2004, the controller 2002 may further include a DRAM controller for controlling the DRAM 2004, in addition to a NAND controller for controlling the semiconductor package 2003.

The semiconductor package 2003 may include first and second semiconductor packages 2003*a* and 2003*b*, which are spaced apart from each other. Each of the first and second semiconductor packages 2003*a* and 2003*b* may be a semiconductor package including a plurality of semiconductor chips 2200. Each of the first and second semiconductor packages 2003*a* and 2003*b* may include a package substrate 2100, the semiconductor chips 2200, which are provided on the package substrate 2100, adhesive layers 2300, which are respectively disposed in bottom surfaces of the semiconductor chips 2200, connection structures 2400, which are used to electrically connect the semiconductor chips 2200 to the package substrate 2100, and a molding layer 2500, which is provided on the package substrate 2100 to cover the semiconductor chips 2200 and the connection structures 2400.

The package substrate 2100 may be or may include or be included in a printed circuit board including package upper pads 2130. Each of the semiconductor chips 2200 may include input/output pads 2210. Each of the input/output pads 2210 may correspond to the input/output pad 1101 of FIG. 1. Each of the semiconductor chips 2200 may include gate stacks 3210 and memory channel structures 3220. Each of the semiconductor chips 2200 may include a three-dimensional semiconductor memory device, which will be described below.

The connection structures 2400 may be or include, for example, bonding wires, which are used to electrically connect the input/output pads 2210 to the package upper pads 2130. For example, in some example embodiments, in each of the first and second semiconductor packages 2003*a* and 2003*b*, the semiconductor chips 2200 may be electrically connected to each other in a bonding wire manner and may be electrically connected to the package upper pads 2130 of the package substrate 2100. Alternatively or additionally, in some example embodiments, the semiconductor chips 2200 in each of the first and second semiconductor packages 2003*a* and 2003*b* may be electrically connected by penetration electrodes (e.g., through silicon vias), not by or in addition to a wire bonding method using the connection structures 2400.

Unlike that illustrated in FIG. 2, the controller 2002 and the semiconductor chips 2200 may be included in a single package. In some example embodiments, the controller 2002 and the semiconductor chips 2200 may be mounted on a separate interposer substrate, not on the main substrate 2001, and may be connected to each other through interconnection lines, which are provided in the interposer substrate.

Figure 3:
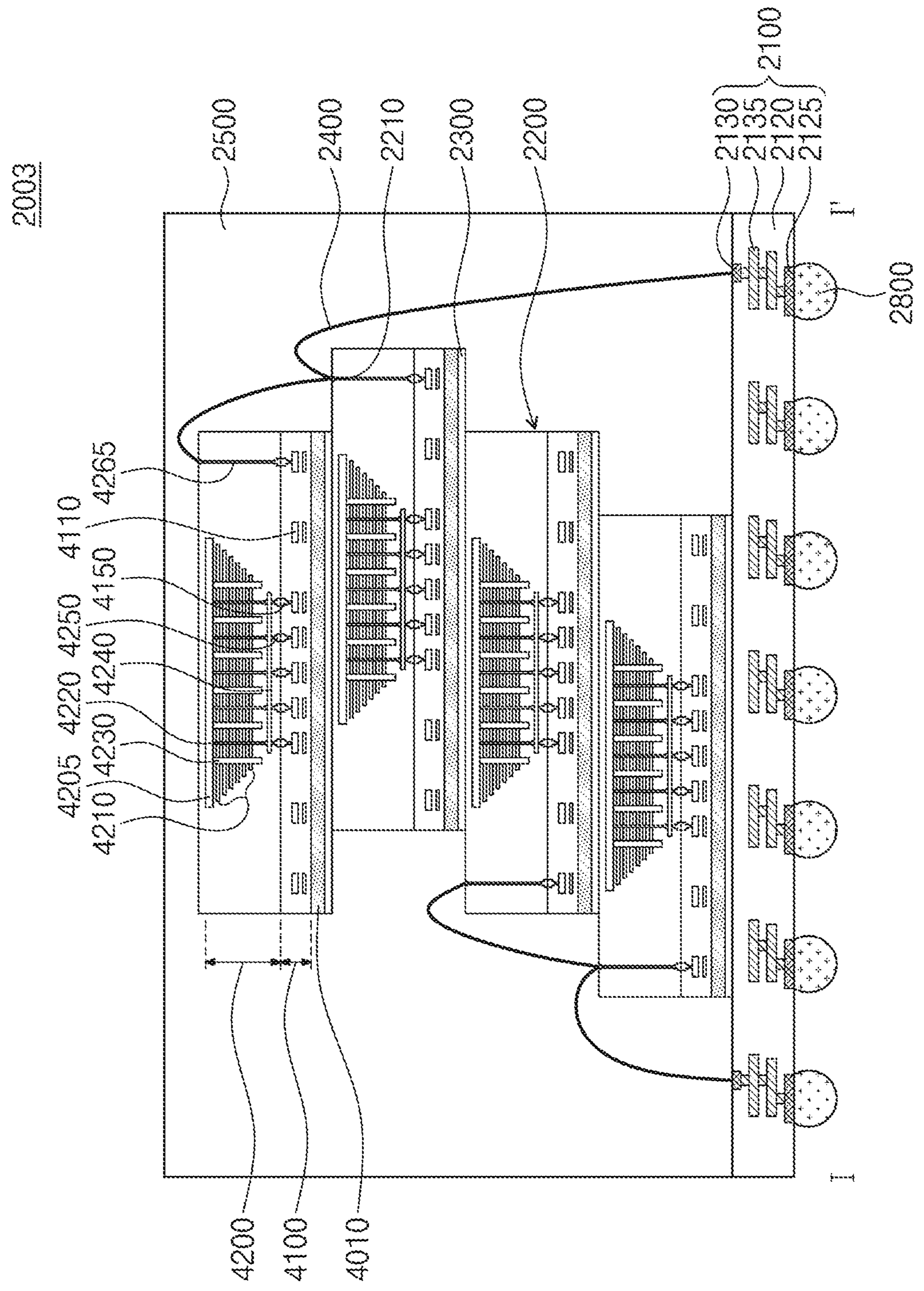
FIGS. 3 and 4 are sectional views, which are respectively taken along lines I-I' and II-II' of FIG. 2 to illustrate a semiconductor package including a three-dimensional semiconductor memory device according to various example embodiments.
Figure 4:
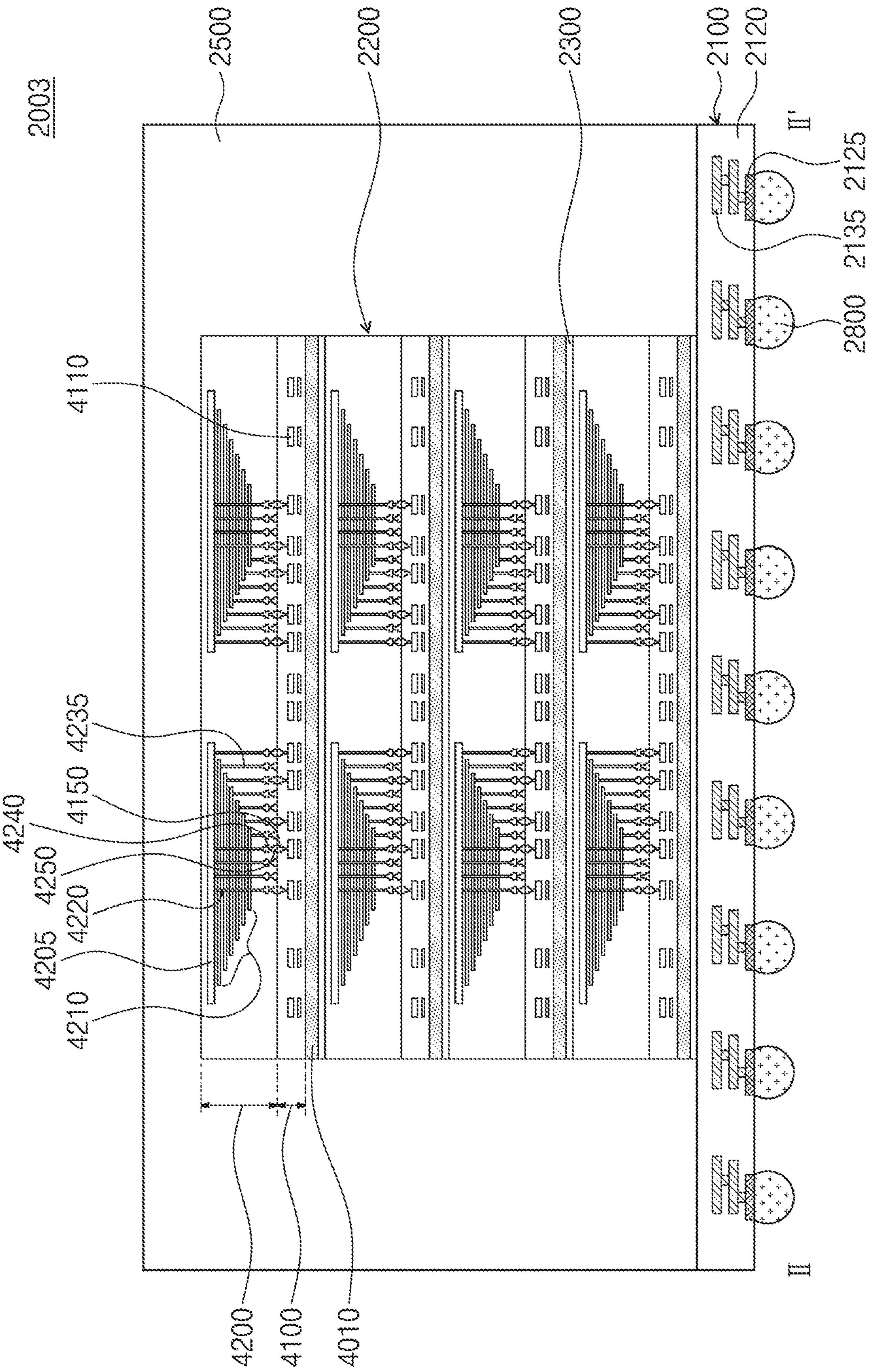

FIGS. 3 and 4 are sectional views, which are respectively taken along lines I-I' and II-II' of FIG. 2 to illustrate a semiconductor package including a three-dimensional semiconductor memory device according to various example embodiments.

Referring to FIGS. 3 and 4, the semiconductor package 2003 may include the package substrate 2100, the semiconductor chips 2200 on the package substrate 2100, and the molding layer 2500 covering the package substrate 2100 and the semiconductor chips 2200.

The package substrate 2100 may include a package substrate body portion 2120, upper pads 2130 provided on a top surface of the package substrate body portion 2120 and exposed to the outside of the package substrate body portion 2120 near the top surface, lower pads 2125 provided on a bottom surface of the package substrate body portion 2120 and/or exposed to the outside of the package substrate body portion 2120 near the bottom surface, and internal lines 2135 provided in the package substrate body portion 2120 to electrically connect the upper pads 2130 to the lower pads 2125. The upper pads 2130 may be electrically connected to the connection structures 2400. The lower pads 2125 may be connected to the interconnection patterns 2005 of the main substrate 2001 of the electronic system 2000, which is shown in FIG. 2, through conductive connecting portions 2800.

Referring to FIGS. 2 and 3, the semiconductor chips 2200 may be provided to have side surfaces, which are not aligned to or flush with each other, and other side surfaces, which are aligned to or flush with each other. The semiconductor chips 2200 may be electrically connected to each other through the connection structures 2400, which are provided in the form of bonding wires. Each of the semiconductor chips 2200 may include the same or substantially the same elements; however, example embodiments are not limited thereto. For example, at least one of the semiconductor chips 2200 may have a different structure than another of the semiconductor chips 2200.

Each of the semiconductor chips 2200 may include a semiconductor substrate 4010, a first structure 4100 on the semiconductor substrate 4010, and a second structure 4200 on the first structure 4100. The second structure 4200 may be connected to the first structure 4100 in a wafer bonding manner.

The first structure 4100 may include peripheral circuit interconnection lines 4110 and first bonding pads 4150. The second structure 4200 may include a common source line 4205, a gate stack 4210, which is provided between the common source line 4205 and the first structure 4100, memory channel structures 4220 and separation structures 4230, which are provided to penetrate the gate stack 4210, and second bonding pads 4250, which are electrically and respectively connected to the memory channel structures 4220 and the word lines WL (e.g., see FIG. 1) of the gate stack 4210. For example, the second bonding pads 4250 may be electrically and respectively connected to the memory channel structures 4220 and the word lines WL through bit lines 4240, which are electrically connected to the memory channel structures 4220, and gate interconnection lines 4235, which are electrically connected to the word lines WL. The first bonding pads 4150 of the first structure 4100 and the second bonding pads 4250 of the second structure 4200 may be in contact with each other and may be coupled to each other. The coupling portions between the first bonding pads 4150 and the second bonding pads 4250 may be formed of or include, for example, copper (Cu).

Each of the semiconductor chips 2200 may further include the input/output pad 2210 and an input/output interconnection line 4265 below the input/output pad 2210. The input/output interconnection line 4265 may be electrically connected to some of the second bonding pads 4250 and some of the peripheral circuit interconnection lines 4110.

Figure 5:
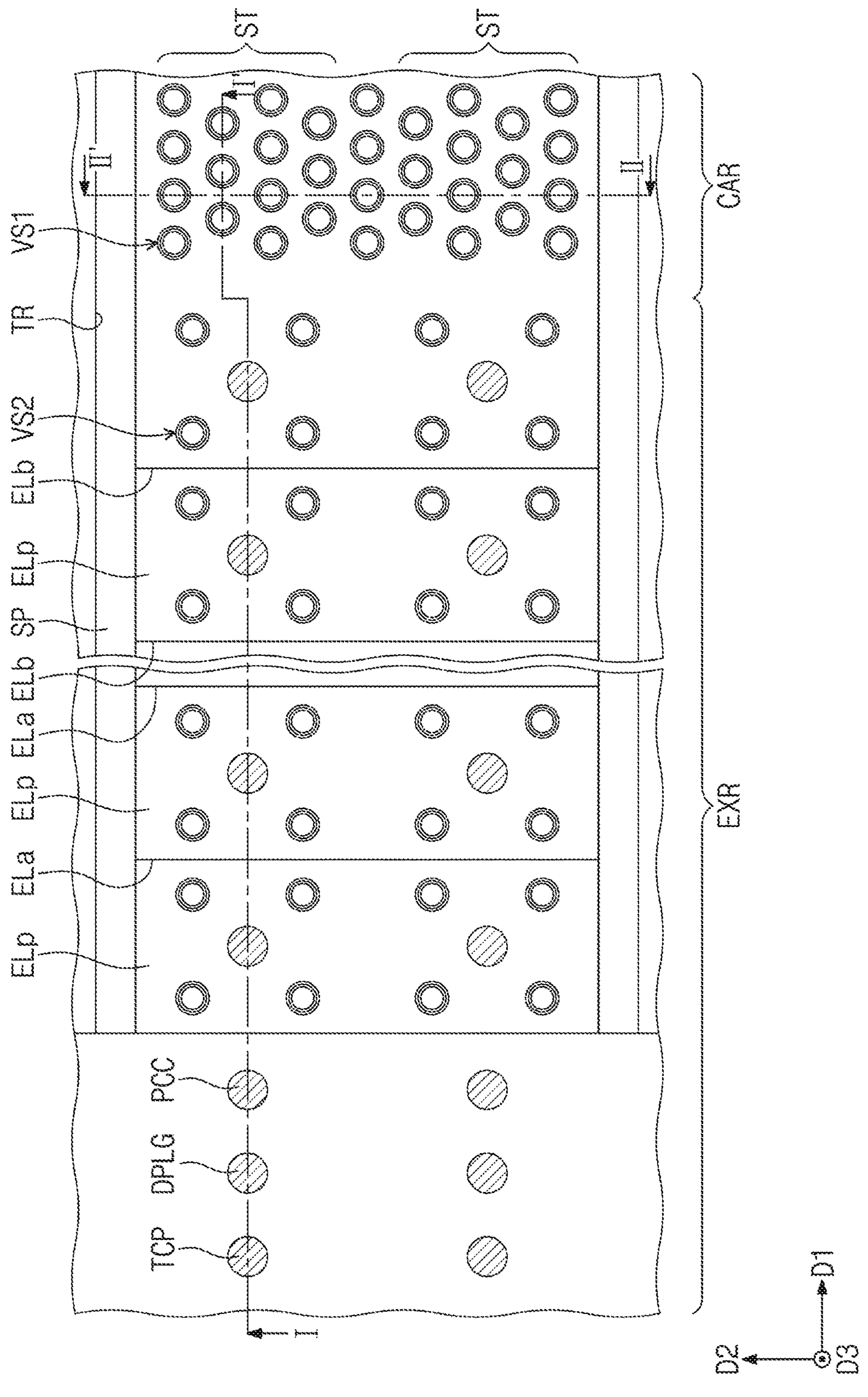
FIG. 5 is a plan view illustrating a three-dimensional semiconductor memory device according to various example embodiments.
Figure 6A:
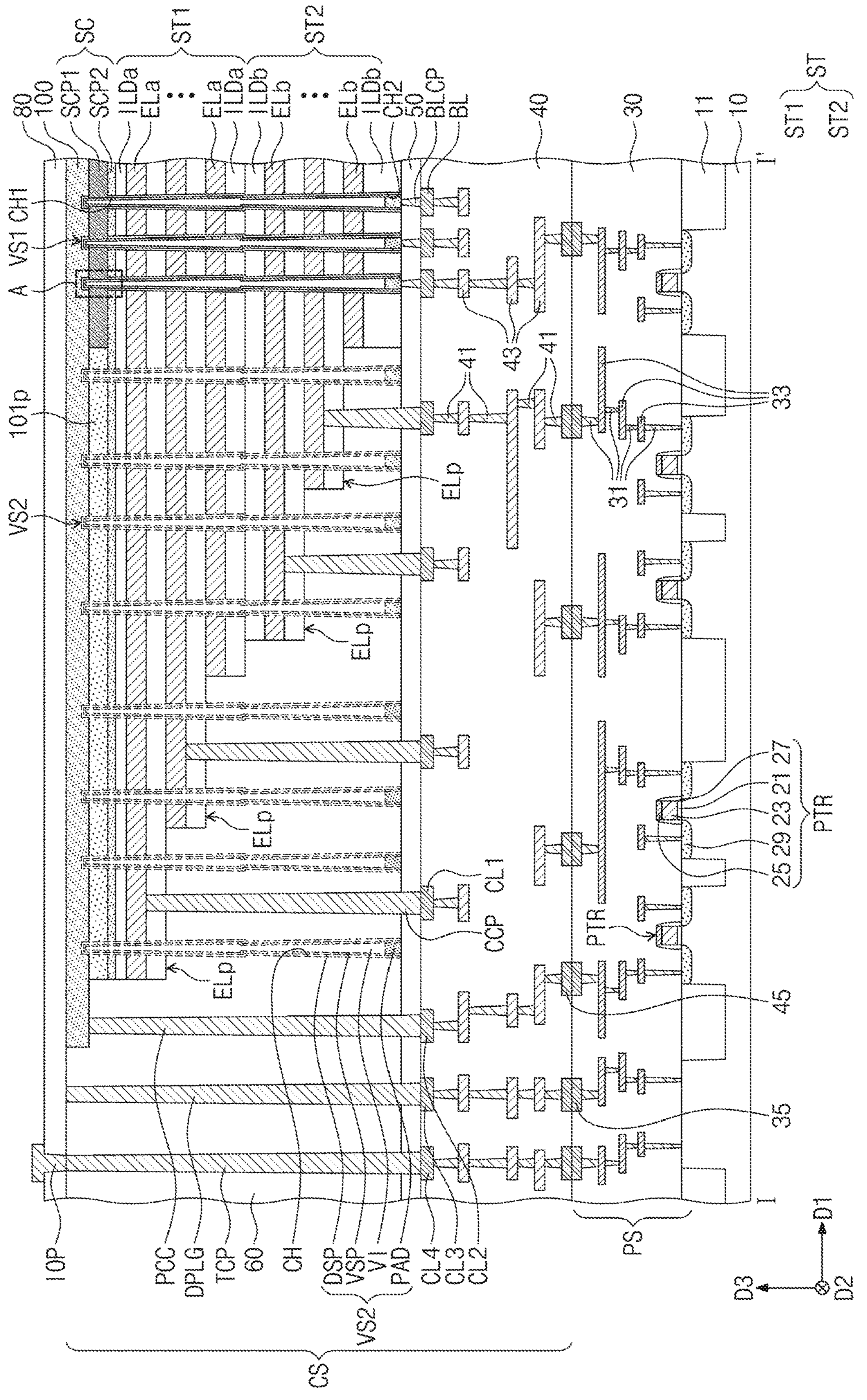
FIGS. 6A and 6B are sectional views, which are respectively taken along lines I-I' and II-II' of FIG. 5 to illustrate a three-dimensional semiconductor memory device according to various example embodiments.
Figure 6B:
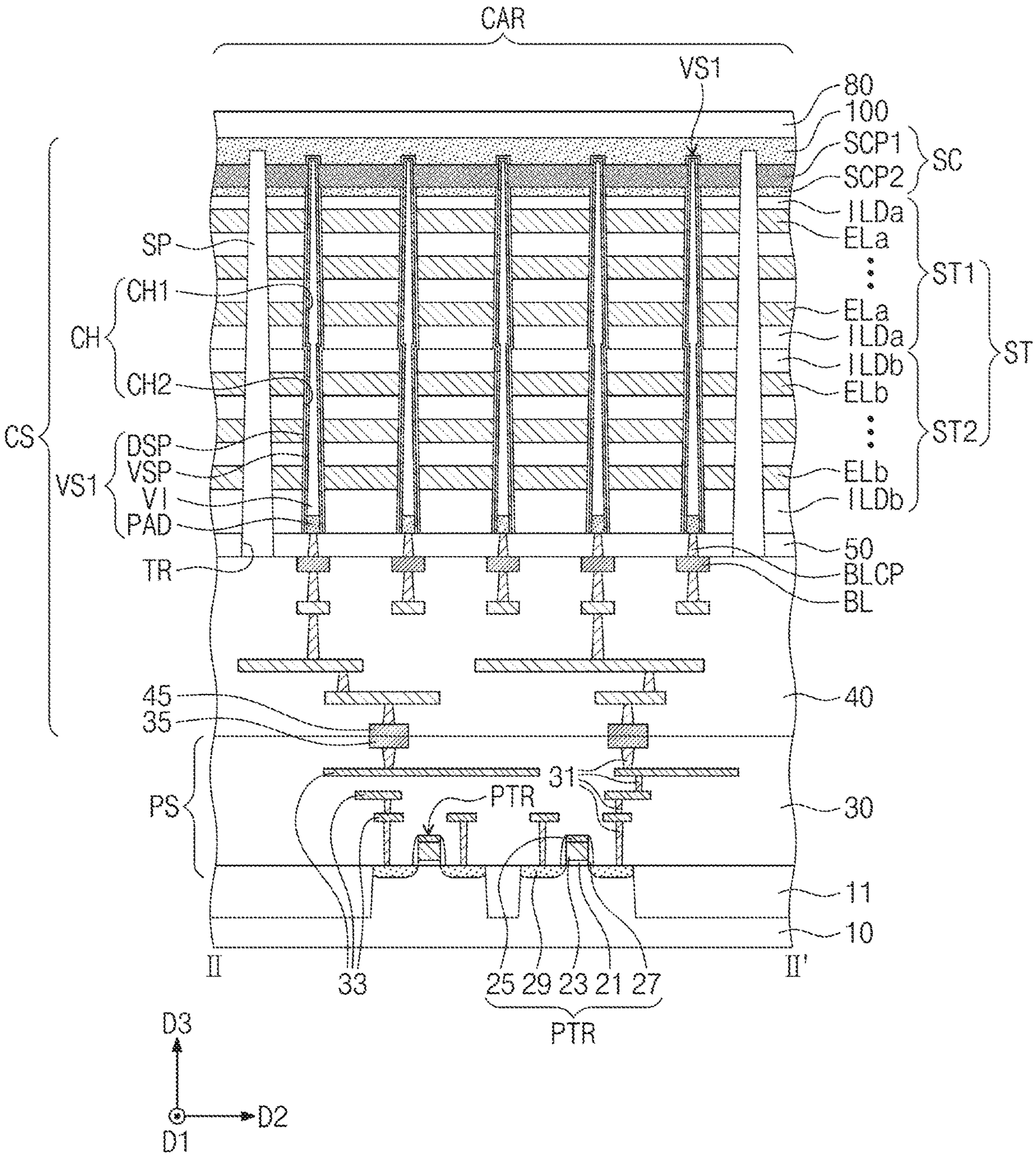

FIG. 5 is a plan view illustrating a three-dimensional semiconductor memory device according to various example embodiments. FIGS. 6A and 6B are sectional views, which are respectively taken along lines I-I' and II-II' of FIG. 5 to illustrate a three-dimensional semiconductor memory device according to various example embodiments.

Referring to FIGS. 5, 6A, and 6B, a three-dimensional semiconductor memory device according to various example embodiments may include a first substrate 10, a peripheral circuit structure PS on the first substrate 10, and a cell array structure CS on the peripheral circuit structure PS. The first substrate 10, the peripheral circuit structure PS, and the cell array structure CS may correspond to the semiconductor substrate 4010, the first structure 4100 on the semiconductor substrate 4010, and the second structure 4200 on the first structure 4100, respectively, described with reference to FIGS. 3 and 4.

Since the peripheral circuit structure PS is coupled to the cell array structure CS thereon, the three-dimensional semiconductor memory device may have an increased cell capacity per unit area. Alternatively or additionally, the peripheral circuit structure PS and the cell array structure CS may be separately fabricated and then may be coupled to each other, and in this case, it may be possible to prevent or reduce the likelihood of and/or the impact from peripheral transistors PTR being damaged by several thermal treatment processes. Accordingly, the electrical and/or reliability characteristics of the three-dimensional semiconductor memory device may be improved.

In some example embodiments, the first substrate 10 may be or may include a silicon substrate, a silicon-germanium substrate, a germanium substrate, or a structure including a single-crystalline silicon substrate and a single-crystalline epitaxial layer grown therefrom, and may be undoped or lightly doped with various impurities. The first substrate 10 may have a top surface that is parallel to two different directions (e.g., a first direction D1 and a second direction D2) and is perpendicular to a third direction D3. For example, the first to third directions D1, D2, and D3 may be orthogonal to each other. A device isolation layer 11 may be provided in the first substrate 10. The device isolation layer 11 may define an active region of the first substrate 10.

The first substrate 10 may include a cell array region CAR and a cell contact region EXR. The cell contact region EXR may be extended from the cell array region CAR in the first direction D1 or an opposite direction of the first direction D1.

The peripheral circuit structure PS may be provided on the first substrate 10, and in some example embodiments, the peripheral circuit structure PS may include the peripheral transistors PTR, peripheral contact plugs 31, peripheral circuit interconnection lines 33 electrically connected to the peripheral transistors PTR through the peripheral contact plugs 31, first bonding pads 35 electrically connected to the peripheral circuit interconnection lines 33, and a first insulating layer 30 enclosing them. The peripheral transistors PTR may be provided on the active region of the first substrate 10. The peripheral circuit interconnection lines 33 may correspond to the peripheral circuit interconnection lines 4110 of FIGS. 3 and 4, and the first bonding pads 35 may correspond to the first bonding pads 4150 of FIGS. 3 and 4.

In some example embodiments, widths of the peripheral contact plugs 31 measured in the first or second direction D1 or D2 may increase as a distance in the third direction D3 increases. The peripheral contact plugs 31 and the peripheral circuit interconnection lines 33 may be formed of or include at least one of conductive materials (e.g., metallic materials and/or doped polysilicon).

For example, the peripheral transistors PTR may constitute or be included in one or more of the decoder circuit 1110, the page buffer 1120, and the logic circuit 1130 of FIG. 1. For example, each of the peripheral transistors PTR may include a peripheral gate insulating layer 21, a peripheral gate electrode 23, a peripheral capping pattern 25, a peripheral gate spacer 27, and peripheral source/drain regions 29. The peripheral gate insulating layer 21 may be provided between the peripheral gate electrode 23 and the first substrate 10. The peripheral capping pattern 25 may be provided on the peripheral gate electrode 23. The peripheral gate spacer 27 may cover side surfaces of the peripheral gate insulating layer 21, the peripheral gate electrode 23, and the peripheral capping pattern 25. The peripheral source/drain regions 29 may be provided in portions of the first substrate 10, which are adjacent to both sides of the peripheral gate electrode 23. The peripheral circuit interconnection lines 33 and the first bonding pads 35 may be electrically connected to the peripheral transistors PTR through the peripheral contact plugs 31. For example, each of the peripheral transistors PTR may be or include an NMOS transistor, a PMOS transistor, and/or a gate-all-around-type transistor. In some example embodiments, the peripheral transistors PTR may be arranged to have the peripheral gate electrode extend in the first direction D1 or in the second direction D2 as illustrated. In some example embodiments, an electrical property, such as a threshold voltage, may be the same as, or different from, each of the peripheral transistors PTR. Additionally or alternatively, a number of layers of peripheral circuit interconnection lines 33 may be the same as illustrated, or may be greater than as illustrated, or may be less than as illustrated; example embodiments are not limited thereto.

The first insulating layer 30 may be provided on the first substrate 10. The first insulating layer 30 on the first substrate 10 may cover, e.g. may fully cover, the peripheral transistors PTR, the peripheral contact plugs 31, and the peripheral circuit interconnection lines 33. The first insulating layer 30 may be a multi-layered structure including a plurality of insulating layers. For example, the first insulating layer 30 may be formed of or include at least one of silicon oxide, silicon nitride, silicon oxynitride, and/or low-k dielectric materials. The first insulating layer 30 may be provided to expose all of or at least a portion of top surfaces of the first bonding pads 35. The first insulating layer 30 may have a top surface that is substantially coplanar with the top surfaces of the first bonding pads 35.

The cell array structure CS, which includes second bonding pads 45, the bit lines BL, a stack ST, and a second substrate 100, may be provided on the peripheral circuit structure PS. The second bonding pads 45, the bit lines BL, the stack ST, and the second substrate 100 may correspond to the second bonding pads 4250, the bit lines 4240, the gate stack 4210, and the common source line 4205, respectively, which are illustrated in FIGS. 3 and 4.

The second bonding pads 45, connection contact plugs 41, connection circuit interconnection lines 43, and a second insulating layer 40 may be provided on the first insulating layer 30. The second bonding pads 45 may be in contact with the first bonding pads 35 of the peripheral circuit structure PS, the connection circuit interconnection lines 43 may be electrically connected to the second bonding pads 45 through the connection contact plugs 41, and the second insulating layer 40 may be provided to enclose the second bonding pads 45, the connection contact plugs 41, and the connection circuit interconnection lines 43. A number of layers of connection circuit interconnection lines 43 may be the same as illustrated, or may be greater than as illustrated, or may be less than as illustrated; example embodiments are not limited thereto.

The second insulating layer 40 may be a multi-layered structure including a plurality of insulating layers. For example, the second insulating layer 40 may be formed of or include at least one of silicon oxide, silicon nitride, silicon oxynitride, and/or low-k dielectric materials.

In some example embodiments, widths of the connection contact plugs 41, which are measured in the first or second direction D1 or D2, may decrease as a distance in the third direction D3 increases. The connection contact plugs 41 and the connection circuit interconnection lines 43 may be formed of or include at least one of conductive materials (e.g., metallic materials and/or doped polysilicon).

The second insulating layer 40 may be formed to expose, e.g. fully expose or at least partly expose, bottom surfaces of the second bonding pads 45. A bottom surface of the second insulating layer 40 may be substantially coplanar with bottom surfaces of the second bonding pads 45. The bottom surface of each of the second bonding pads 45 may be in direct contact with the top surface of each of the first bonding pads 35. The first and second bonding pads 35 and 45 may independently or concurrently be formed of or include at least one of metallic materials (e.g., copper (Cu), tungsten (W), aluminum (Al), nickel (Ni), or tin (Sn)), and may or may not include the same metallic materials. For example, the first and second bonding pads 35 and 45 may be formed of or include copper (Cu). The first and second bonding pads 35 and 45 may be connected to each other without any interface therebetween and may form a single object. The side surfaces of the first and second bonding pads 35 and 45 are illustrated to be aligned to each other, but the inventive concept is not limited to this example. When viewed in a plan view, the side surfaces of the first and second bonding pads 35 and 45 may be spaced apart from each other.

The bit lines BL and first to fourth conductive lines CL1, CL2, CL3, and CL4, which are in contact with the connection contact plugs 41, may be provided in an upper portion of the second insulating layer 40. In some example embodiments, the bit lines BL and the first to fourth conductive lines CL1, CL2, CL3, and CL4 may be extended in the second direction D2 and may be spaced apart from each other in the first direction D1. The bit lines BL and the first to fourth conductive lines CL1, CL2. CL3, and CL4 may be formed of or include at least one of conductive materials (e.g., metallic materials).

A third insulating layer 50 may be provided on the second insulating layer 40. A fourth insulating layer 60 and the stack ST, which is enclosed by the fourth insulating layer 60, may be provided on the third insulating layer 50. The third and fourth interlayer insulating layers 50 and 60 may be a multi-layered structure including a plurality of insulating layers. For example, the third and fourth insulating layers 50 and 60 may be formed of or include at least one of silicon oxide, silicon nitride, silicon oxynitride, and/or low-k dielectric materials.

Bit line contact plugs BLCP may be provided in the third insulating layer 50. The bit line contact plugs BLCP may be extended in the third direction D3 to connect the bit lines BL to first vertical channel structures VS1, which will be described below.

Cell contact plugs CCP, a substrate contact plug PCC, a dummy plug DPLG, and a penetration contact plug TCP may be provided on the cell contact region EXR to penetrate the third and fourth insulating layers 50 and 60. The cell contact plugs CCP may be extended in the third direction D3 to connect the first conductive lines CL1 to gate electrodes ELa and ELb of the stack ST, which will be described below. Each of the cell contact plugs CCP may be provided to penetrate one of interlayer insulating layers ILDa and ILDb of the stack ST to be described below. The substrate contact plug PCC may be extended in the third direction D3 to connect the second conductive line CL2 to the second substrate 100 to be described below. The substrate contact plug PCC may be in contact with the second substrate 100. The dummy plug DPLG may be extended in the third direction D3 and may be connected to the third conductive line CL3. The dummy plug DPLG and the second substrate 100 may be spaced apart from each other in the first direction D1. In some example embodiments, the dummy contact plug DPLG may not be electrically active during operation of the semiconductor device. In some example embodiments, the dummy contact plug DPLG may provide structural support to the semiconductor device, and/or may help improve ease of manufacturability of the semiconductor device. The penetration contact plug TCP may be extended in the third direction D3 to connect the fourth conductive line CL4 to an input/output pad IOP to be described below.

The bit line contact plugs BLCP, the cell contact plugs CCP, the substrate contact plug PCC, the dummy plug DPLG, and the penetration contact plug TCP may be spaced apart from each other in the first direction D1, e.g. by a constant distance or by varying distances. Widths of the bit line contact plugs BLCP, the cell contact plugs CCP, the substrate contact plug PCC, the dummy plug DPLG, and the penetration contact plug TCP in the first or second direction D1 or D2 may decrease, e.g. may taper, as a distance in the third direction D3 increases. The bit line contact plugs BLCP, the cell contact plugs CCP, the substrate contact plug PCC, the dummy plug DPLG, and the penetration contact plug TCP may be formed of or include at least one of conductive materials (e.g., metallic materials and/or doped polysilicon).

A level of a top surface of the dummy plug DPLG may be higher than or above a level of a top surface of the substrate contact plug PCC. The level of the top surface of the dummy plug DPLG may be substantially equal to the level of the top surface of the penetration contact plug TCP.

As used herein, the expression "two elements are connected to each other" will be used to represent all possible connections between the elements (e.g., they are directly or just electrically connected to each other or are connected to each other through another element interposed therebetween).

The dummy plug DPLG may be connected to one of the second bonding pads 45 through a specific path consisting of or corresponding to or including the third conductive line CL3, the connection contact plug 41, and the connection circuit interconnection line 43. The second bonding pad 45, which is connected to the dummy plug DPLG, may be connected to one of the first bonding pads 35. The first bonding pad 35, which is connected to the dummy plug DPLG through the second bonding pad 45, may be connected to the first substrate 10 through a specific path consisting of the peripheral contact plugs 31 and the peripheral circuit interconnection lines 33. For example, the dummy plug DPLG may be connected to the first substrate 10. Although not illustrated, the dummy plug DPLG may be connected to one of the peripheral source/drain regions 29. In some example embodiments, the dummy plug DPLG may be grounded to the first substrate 10. The dummy plug DPLG may be electrically disconnected from all of the first and second bonding pads 35 and 45, except for the afore-described ones of the first and second bonding pads 35 and 45 electrically connected to the dummy plug DPLG. The dummy plug DPLG may be disconnected from the second substrate 100, the cell contact plugs CCP, the substrate contact plug PCC, the penetration contact plug TCP, first and second vertical channel structures VS1 and VS2 to be described below, and the gate electrodes ELa and ELb to be described below. Thus, there may be only one electrical path that is connected from the dummy plug DPLG to the first substrate 10.

According to various example embodiments, the dummy plug DPLG may be grounded to the first substrate 10 through the third conductive line CL3, the connection contact plugs 41, the connection circuit interconnection lines 43, one second bonding pad 45, one first bonding pad 35, the peripheral contact plugs 31, and the peripheral circuit interconnection lines 33. Here, by performing an inspection such as an electron beam (EB) inspection on the dummy plug DPLG, it may be possible to examine and determine whether there is an inner defect (e.g., a crack) in the first bonding pad 35 and the second bonding pad 45 connected to the dummy plug DPLG. Thus, during a fabrication process, it may be possible to sort and exclude a device, which has an inner defect occurred during a bonding process between the peripheral circuit structure PS and the cell array structure CS, without any destructive inspection method, and this may make it possible to improve the electrical and/or reliability characteristics of the three-dimensional semiconductor memory device. For example, in an EB inspection on the dummy plug DPLG, the dummy plug DPLG may charge up or may not charge up depending on a path to the ground, which may be disturbed by an inner defect such as a crack.

Alternatively or additionally, the input/output pad IOP may not be provided on the dummy plug DPLG. Thus, it may be possible to prevent or reduce the likelihood of and/or impact from a three-dimensional semiconductor memory device from being damaged by a dry etching process, which may be performed to form the input/output pad IOP, and as thereby to fabricate a three-dimensional semiconductor memory device with improved electrical and/or reliability characteristics.

The stack ST may be provided on the third insulating layer 50. The stack ST may be enclosed by the fourth insulating layer 60. A bottom surface of the stack ST (i.e., in contact with the third insulating layer 50) may be substantially coplanar with a bottom surface of the fourth insulating layer 60.

In some example embodiments, a plurality of the stacks ST may be provided. When viewed in the plan view of FIG. 5, the stacks ST may be extended in the first direction D1 and may be spaced apart from each other in the second direction D2. Hereinafter, just one stack ST will be described, for brevity's sake, others of the stacks ST may also have substantially the same features as described below.

The stack ST may include a first stack ST1 and a second stack ST2. The first stack ST1 may include first interlayer insulating layers ILDa and first gate electrodes ELa, which are alternately stacked on top of each other, and the second stack ST2 may include second interlayer insulating layers ILDb and second gate electrodes ELb, which are alternately stacked on top of each other.

The second stack ST2 may be provided between the first stack ST1 and the first substrate 10. For example, the second stack ST2 may be provided on a bottom surface of the bottommost one of the first interlayer insulating layers ILDa of the first stack ST1. The topmost one of the second interlayer insulating layers ILDb of the second stack ST2 may be in contact with the bottommost one of the first interlayer insulating layers ILDa of the first stack ST1, but the inventive concept is not limited to this example. For example, a single insulating layer may be provided between the topmost one of the second gate electrodes ELb of the second stack ST2 and the first gate electrodes ELa of the first stack ST1.

The first and second gate electrodes ELa and ELb may be formed of or include at least one of, for example, doped semiconductor materials (e.g., doped silicon such as doped polysilicon and so forth), metallic materials (e.g., one or more of tungsten, copper, aluminum, and so forth), conductive metal nitrides (e.g., one or more of titanium nitride, tantalum nitride, and so forth), or transition metals (e.g., one or more of titanium, tantalum, and so forth). The first and second interlayer insulating layers ILDa and ILDb may be formed of or include at least one of silicon oxide, silicon nitride, silicon oxynitride, and/or low-k dielectric materials. For example, the first and second interlayer insulating layers ILDa and ILDb may be formed of or include high density plasma (HDP) oxide and/or tetraethyl orthosilicate (TEOS).

On the cell contact region EXR, a thickness of each of the first and second stacks ST1 and ST2 in the third direction D3 may decrease as a distance from the outermost one of the first vertical channel structures VS1 increases. For example, each of the first and second stacks ST1 and ST2 may have a staircase structure in the first direction D1.

More specifically, lengths of the first and second gate electrodes ELa and ELb of the first and second stacks ST1 and ST2 in the first direction D1 may increase as a distance from the first substrate 10 increases. Side surfaces of the first and second gate electrodes ELa and ELb may be spaced apart from each other by a specific distance in the first direction D1, when viewed in the plan view of FIG. 5. The lowermost one of the second gate electrodes ELb of the second stack ST2 may have the smallest length in the first direction D1, and the uppermost one of the first gate electrodes ELa of the first stack ST1 may have the largest length in the first direction D1.

The first and second gate electrodes ELa and ELb may include pad portions ELp provided on the cell contact region EXR. The pad portions ELp may be disposed at positions that are different from each other in horizontal and vertical directions. The pad portions ELp may be provided to form a staircase structure in the first direction D1. Each of the cell contact plugs CCP may penetrate a corresponding one of the first and second interlayer insulating layers ILDa and ILDb and may be in contact with the pad portion ELp of a corresponding one of the first and second gate electrodes ELa and ELb.

Each of the first and second interlayer dielectric layers ILDa and ILDb may be provided between a corresponding pair of the first and second gate electrodes ELa and ELb and may have a side surface that is aligned to a side surface of a corresponding one of the first and second gate electrodes ELa and ELb, which are in contact with an upper portion thereof. For example, similar to the first and second gate electrodes ELa and ELb, lengths of the first and second interlayer dielectric layers ILDa and ILDb in the first direction D1 may increase as a distance from the first substrate 10 increases. In some example embodiments, the bottommost one of the second interlayer dielectric layers ILDb may have the largest thickness in the third direction D3, and the topmost one of the first interlayer dielectric layers ILDa may have the smallest thickness in the third direction D3. However, example embodiments are not limited to this example.

On the cell array region CAR, vertical channel holes CH may be provided to penetrate the stack ST in the third direction D3, and the first vertical channel structures VS1 may be respectively provided in the vertical channel holes CH on the cell array region CAR. The first vertical channel structures VS1 may correspond to the memory channel structures 4220 of FIGS. 3 and 4.

On the cell contact region EXR, the second vertical channel structures VS2 may be provided in vertical channel holes CH, which are formed to penetrate at least a portion of the stack ST and the fourth insulating layer 60 in the third direction D3.

The vertical channel holes CH may include first vertical channel holes CH1 and second vertical channel holes CH2, which are connected to the first vertical channel holes CH1. Widths of the first and second vertical channel holes CH1 and CH2 measured in the first or second direction D1 or D2 may decrease or taper as a distance from the first substrate 10 increases. The first and second vertical channel holes CH1 and CH2 may have diameters different from each other near a boundary region where the first and second vertical channel holes CH1 and CH2 are connected to each other. In detail, an upper diameter of each of the second vertical channel holes CH2 may be smaller than a lower diameter of each of the first vertical channel holes CH1. The first and second vertical channel holes CH1 and CH2 may form a stepwise structure near the boundary region. However, embodiments not limited to this example, and in some example embodiments, the first and second vertical channel structures VS1 and VS2 may be provided in three or more vertical channel holes CH, which are provided to form stepwise structures at two or more different levels, or may be provided in the vertical channel holes CH whose side surfaces are substantially flat without such a stepwise structure.

Each of the first and second vertical channel structures VS1 and VS2 may include a conductive pad PAD adjacent to the third insulating layer 50, a data storage pattern DSP covering or conformally covering an inner side surface of each of the first and second vertical channel holes CH1 and CH2, a vertical semiconductor pattern VSP covering or conformally covering a side surface of the data storage pattern DSP, and a gapfill insulating pattern VI filling an internal space of each of the first and second vertical channel holes CH1 and CH2 enclosed by the vertical semiconductor pattern VSP and the conductive pad PAD. The vertical semiconductor pattern VSP may be enclosed by the data storage pattern DSP. Each of the first and second vertical channel structures VS1 and VS2 may have a circular, elliptical, or bar-shaped bottom surface.

The vertical semiconductor pattern VSP may be provided between the data storage pattern DSP and the gap-fill insulating pattern VI and between the data storage pattern DSP and the conductive pad PAD. The vertical semiconductor pattern VSP may have a top-closed pipe and/or macaroni structure. The data storage pattern DSP may have a top-opened pipe or macaroni structure. The vertical semiconductor pattern VSP may be formed of or include at least one of doped semiconductor materials or undoped or intrinsic semiconductor materials and may have a polycrystalline structure. In some example embodiments, the conductive pad PAD may be formed of or include at least one of doped semiconductor materials or conductive materials.

When viewed in the plan view of FIG. 5, a trench TR may be provided to extend in the first direction D1 and to cross the stack ST. The trench TR may be extended from the cell array region CAR toward the cell contact region EXR. A width of the trench TR in the first or second direction D1 or D2 may decrease or taper as a distance from the first substrate 10 increases. In some example embodiments, a plurality of the trenches TR may be provided. Hereinafter, one of the trenches TR will be described by all example, but all of the trenches TR may be provided to have substantially the same features as the trench TR to be described below.

A separation pattern SP may be provided to fill an inner space of the trench TR. The separation pattern SP may correspond to the separation structures 4230 of FIGS. 3 and 4. A side surface of the separation pattern SP may be in contact with at least a portion of the first and second gate electrodes ELa and ELb and the first and second interlayer insulating layers ILDa and ILDb of the stack ST. In some example embodiments, the separation pattern SP may be formed of or include at least one of oxide materials (e.g., silicon oxide).

A bottom surface of the separation pattern SP may be substantially coplanar with a bottom surface of the third insulating layer 50 (e.g., a top surface of the second insulating layer 40) and top surfaces of the bit lines BL and the first to fourth conductive lines CL1, CL2, CL3, and CL4. A top surface of the separation pattern SP may be located at a level that is higher than the top surfaces of the first and second vertical channel structures VS1 and VS2, but the inventive concept is not limited to this example.

In the case where a plurality of the stacks ST are provided, the separation pattern SP may be provided between the stacks ST, which are arranged in the second direction D2. For example, the stacks ST may be spaced apart from each other with the separation pattern SP interposed therebetween, in the second direction D2.

A second substrate 100 may be provided on the stack ST. The second substrate 100 may be extended in the first and second directions D1 and D2. The second substrate 100 may be a plate-shaped pattern that is extended parallel to the top surface of the first substrate 10. The second substrate 100 may not be provided on a portion region of the cell contact region EXR. The second substrate 100 may be or may include a semiconductor substrate including a semiconductor material. The second substrate 100 may be formed of or include at least one of silicon (Si), germanium (Ge), silicon germanium (SiGe), gallium arsenic (GaAs), indium gallium arsenic (InGaAs), or aluminum gallium arsenic (AlGaAs), and may or may not be formed of or include the same material as the first substrate 10.

An upper portion of each of the first and second vertical channel structures VS1 and VS2 and the substrate contact plug PCC may be in contact with the second substrate 100. The first and second vertical channel structures VS1 and VS2 and the substrate contact plug PCC may be provided to penetrate at least a portion of the second substrate 100.

A source structure SC and a dummy insulating pattern 101*p* may be interposed between the stack ST and the second substrate 100. The source structure SC may be extended in the first and second directions D1 and D2.

The source structure SC may include a first source conductive pattern SCP1 on the stack ST and a second source conductive pattern SCP2 between the stack ST and the first source conductive pattern SCP1. The second source conductive pattern SCP2 may be provided between the first source conductive pattern SCP1 and the topmost one of the first interlayer insulating layers ILDa of the first stack ST1. The second source conductive pattern SCP2 may be in direct contact with the first source conductive pattern SCP1. The second source conductive pattern SCP2 may be extended from the cell array region CAR toward the cell contact region EXR. The first source conductive pattern SCP1 may be provided on only the cell array region CAR. A thickness of the first source conductive pattern SCP1 in the third direction D3 may be larger than a thickness of the second source conductive pattern SCP2 in the third direction D3. The source structure SC may be formed of or include at least one of doped semiconductor materials. The source structure SC may be formed of or include a semiconductor material that is doped to have the same conductivity type as the second substrate 100. For example, an impurity concentration of the first source conductive pattern SCP1 may be greater than an impurity concentration of the second source conductive pattern SCP2 and an impurity concentration of the second substrate 100.

The dummy insulating pattern 101*p* may be provided in the cell contact region EXR. Top and bottom surfaces of the dummy insulating pattern 101*p* may be coplanar with top and bottom surfaces of the first source conductive pattern SCP1. A side surface of the dummy insulating pattern 101*p* may be spaced apart from a side surface of the second substrate 100. For example, the dummy insulating pattern 101*p* may be formed of or include silicon nitride. In some example embodiments, the dummy insulating pattern 101*p* may have a multi-layered structure including a plurality of insulating layers.

A fifth insulating layer 80 may be provided on the second substrate 100 and the fourth insulating layer 60. The input/output pad IOP may be provided to penetrate the fifth insulating layer 80 and to be connected to the penetration contact plug TCP.

The input/output pad IOP may be electrically connected to the fourth conductive line CL4 through the penetration contact plug TCP and moreover may be electrically connected to at least one of the peripheral transistors PTR of the peripheral circuit structure PS. The input/output pad IOP may include a protruding portion that is extended to a level higher than a top surface of the fifth insulating layer 80, but the inventive concept is not limited to this example. The input/output pad IOP may correspond to the input/output pad 1101 of FIG. 1 or the input/output pads 2210 of FIGS. 3 and 4.

Figure 7:
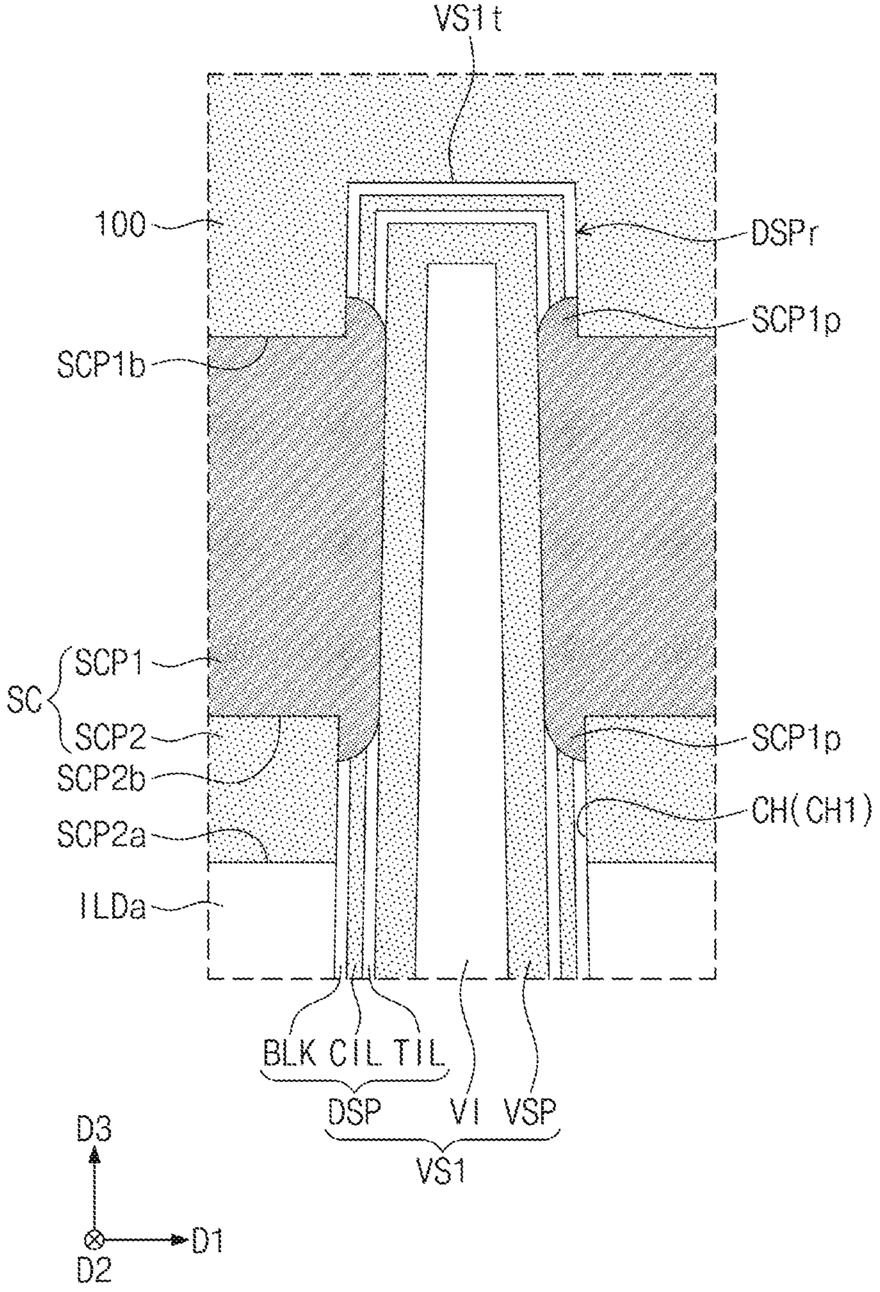
FIG. 7 is an enlarged sectional view illustrating a portion (e.g., A of FIG. 6A) of a three-dimensional semiconductor memory device according to various example embodiments.

FIG. 7 is an enlarged sectional view illustrating a portion of a three-dimensional semiconductor memory device according to various example embodiments and corresponding to a portion 'A' of FIG. 6A.

Referring to FIG. 7, the second substrate 100, the source structure SC, and one of the first vertical channel structures VS1 are illustrated. Hereinafter, one of the vertical channel holes CH and one of the first vertical channel structures VS1 will be described, for brevity's sake, but the others may have substantially the same features as described below.

A top surface VS1*t* of the first vertical channel structure VS1 may be in contact with the second substrate 100. The top surface VS It of the first vertical channel structure VS1 may correspond to a top surface of the lower data storage pattern DSPr. The top surface VS It of the first vertical channel structure VS1 may be located at a level that is higher than a top surface SCP1*b* of the first source conductive pattern SCP1.

The data storage pattern DSP may include a blocking insulating layer BLK, a charge storing layer CIL, and a tunneling insulating layer TIL, which are sequentially stacked on a side surface of the vertical channel hole CH. The blocking insulating layer BLK may be adjacent to the stack ST or the source structure SC, and the tunneling insulating layer TIL may be adjacent to the vertical semiconductor pattern VSP. The charge storing layer CIL may be interposed between the blocking insulating layer BLK and the tunneling insulating layer TIL. The blocking insulating layer BLK, the charge storing layer CIL, and the tunneling insulating layer TIL may be extended from a region between the stack ST and the vertical semiconductor pattern VSP in the third direction D3. In some example embodiments, a Fowler-Nordheim (FN) tunneling phenomenon, which may be caused by a voltage difference between the vertical semiconductor pattern VSP and the first and second gate electrodes ELa and ELb, may be used to store or change data in the data storage pattern DSP. In some example embodiments, the blocking insulating layer BLK and the tunneling insulating layer TIL may be formed of or include silicon oxide, and the charge storing layer CIL may be formed of or include silicon nitride or silicon oxynitride (and may or may not include silicon oxide).

The first source conductive pattern SCP1 of the source structure SC may be in contact with the vertical semiconductor pattern VSP, and the second source conductive pattern SCP2 may be spaced apart from the vertical semiconductor pattern VSP with the data storage pattern DSP interposed therebetween. The first source conductive pattern SCP1 may be spaced apart from the gapfill insulating pattern VI with the vertical semiconductor pattern VSP interposed therebetween.

More specifically, the first source conductive pattern SCP1 may include protruding portions SCP1*p*, which are located at a level that is lower than a top surface SCP2*b* of the second source conductive pattern SCP2 or is higher than the top surface SCP1*b* of the first source conductive pattern SCP1. However, the protruding portions SCP1*p* may be located at a level higher than a bottom surface SCP2*a* of the second source conductive pattern SCP2. In some example embodiments, each of the protruding portions SCP1*p*, which are in contact with the data storage pattern DSP or the lower data storage pattern DSPr, may have a non-straight surface, e.g. a curved surface.

FIGS. 8A, 9A, 10A, 11A, and 12A are sectional views, which are respectively taken along the line I-f of FIG. 5 to illustrate a method of fabricating a three-dimensional semiconductor memory device according to various example embodiments. FIGS. 8B, 9B, 10B, 11B, and 12B are sectional views, which are respectively taken along the line II-If of FIG. 5 to illustrate a method of fabricating a three-dimensional semiconductor memory device according to various example embodiments.

Hereinafter, the fabricating method according to various example embodiments will be described in more detail with reference to the drawings from FIGS. 8A and 8B to FIGS. 12A and 12B.

Figure 8A:
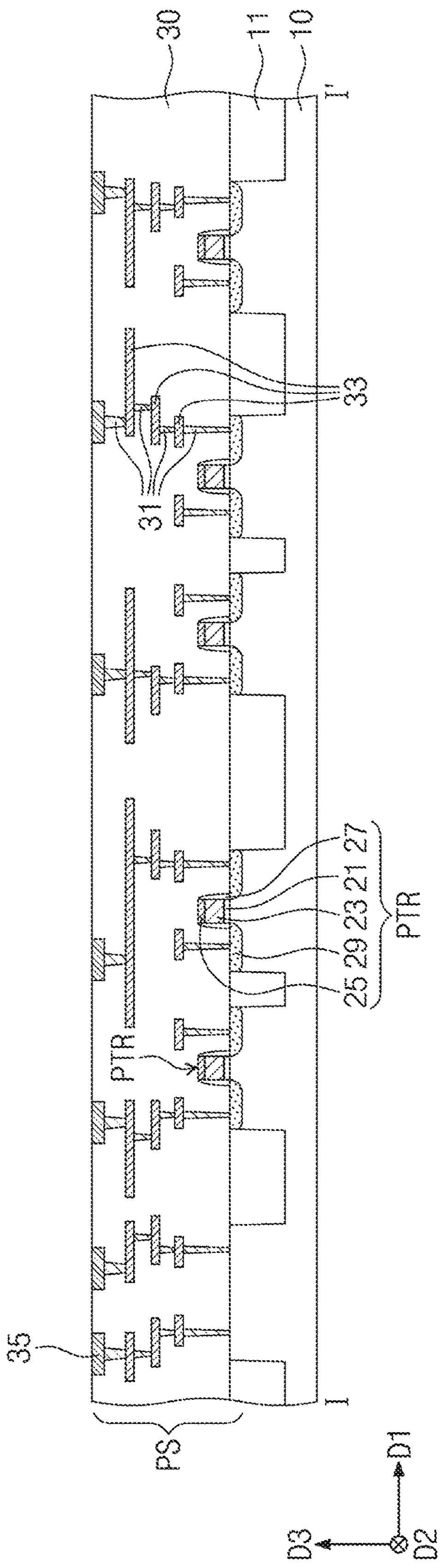
FIGS. 8A, 9A, 10A, 11A, and 12A are sectional views, which are respectively taken along the line I-I' of FIG. 5 to illustrate a method of fabricating a three-dimensional semiconductor memory device according to various example embodiments.
Figure 8B:
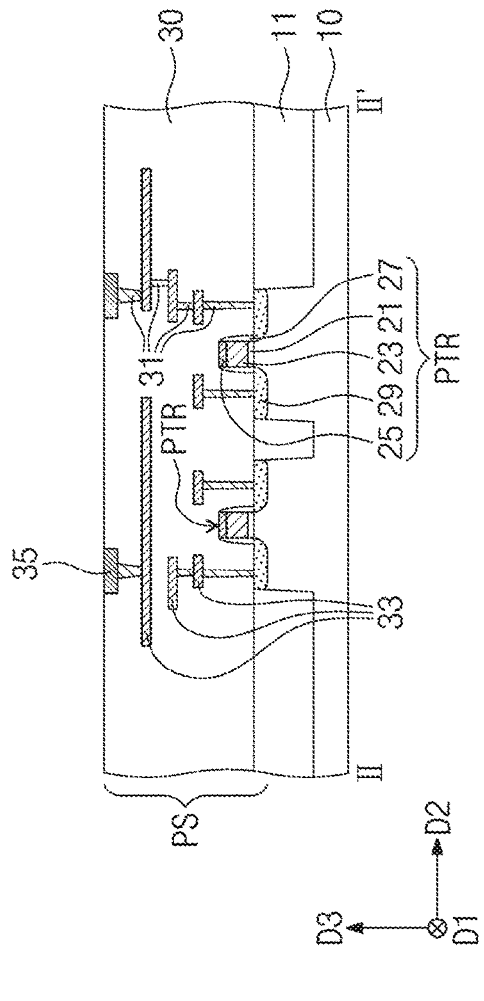
FIGS. 8B, 9B, 10B, 11B, and 12B are sectional views, which are respectively taken along the line II-If of FIG. 5 to illustrate a method of fabricating a three-dimensional semiconductor memory device according to various example embodiments.

Referring to FIGS. 8A and 8B, the peripheral circuit structure PS may be formed on the first substrate 10. The formation of the peripheral circuit structure PS may include forming the device isolation layer 11 in the first substrate 10 to define an active region, forming the peripheral transistors PTR on the active region of the first substrate 10, and forming the peripheral contact plugs 31, the peripheral circuit interconnection lines 33, the first bonding pads 35, which are electrically connected to the peripheral transistors PTR, and the first insulating layer 30 covering them.

The top surfaces of the first bonding pads 35 may be substantially coplanar with the top surface of the first insulating layer 30. In the following description, the expression of "two elements are coplanar with each other" may mean or indicate that a planarization process may be performed on the elements. The planarization process may be performed using, for example, a chemical mechanical polishing (CMP) process and/or an etch-back process.

Figure 9A:
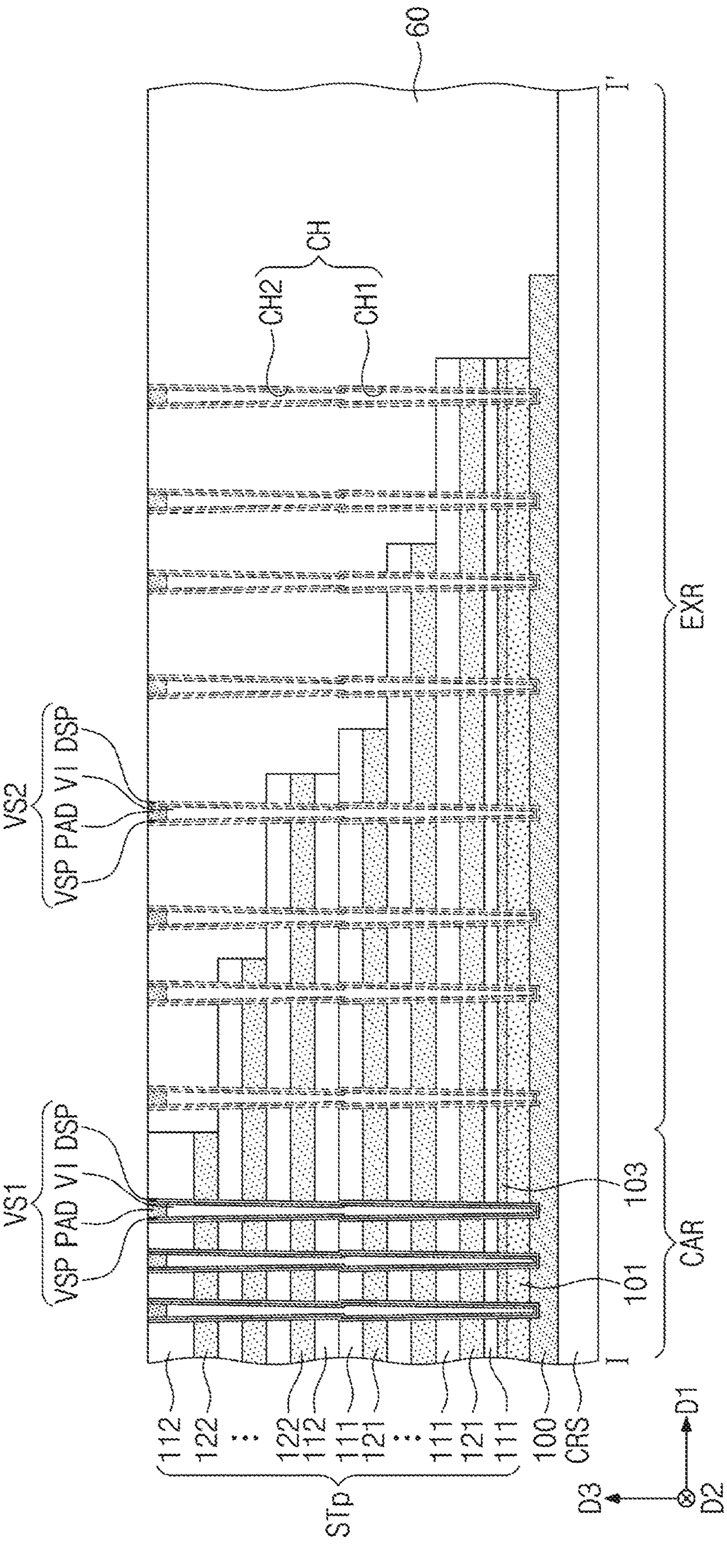
Figure 9B:
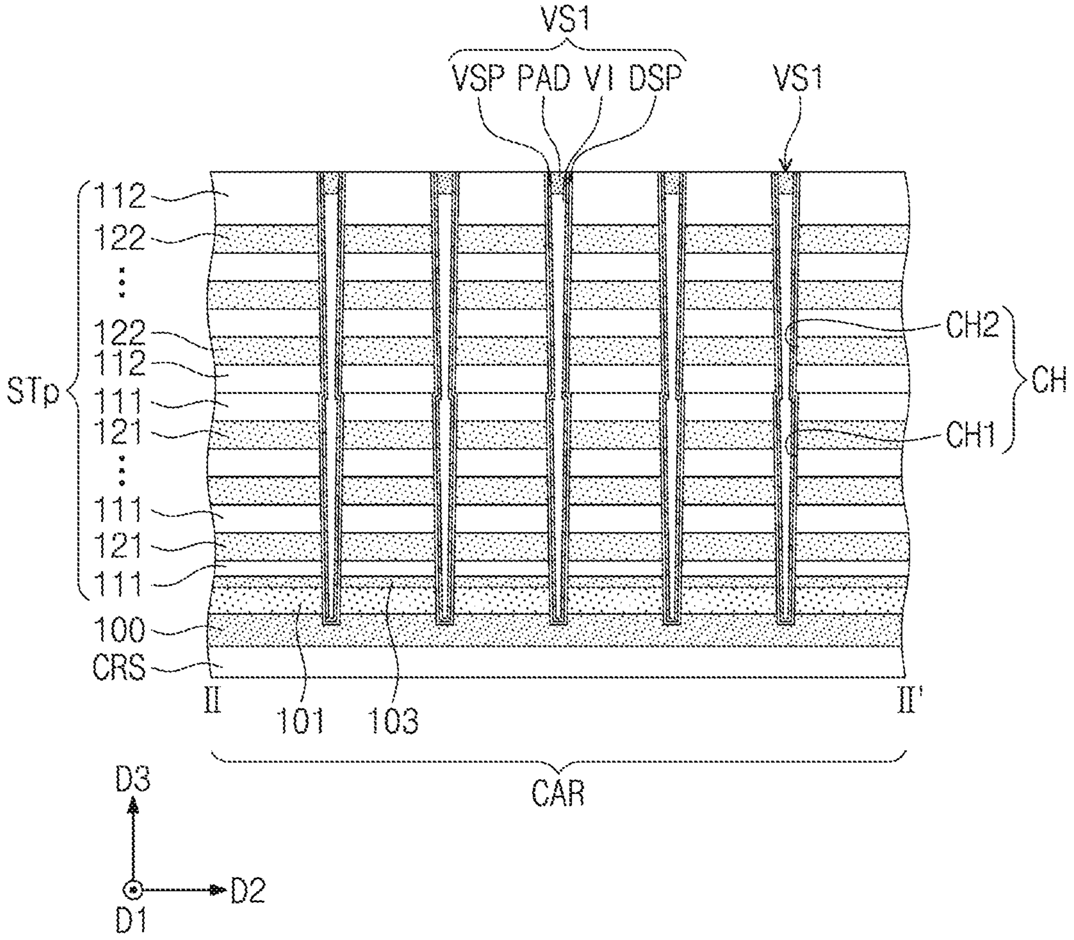

Referring to FIGS. 9A and 9B, the second substrate 100, a lower sacrificial layer 101, and a lower semiconductor layer 103 may be formed on a carrier substrate CRS. In some example embodiments, the second substrate 100 and the lower semiconductor layer 103 may be formed by depositing a semiconductor material, which is doped with impurities of a first conductivity type (e.g., n-type), such as but not limited to phosphorus and/or arsenic. The lower sacrificial layer 101 may be formed of or include, for example, silicon nitride. In some example embodiments, the lower sacrificial layer 101 may be formed to have a multi-layered structure including a plurality of insulating layers.

A preliminary stack STp may be formed on the lower semiconductor layer 103, and in some example embodiments, the preliminary stack STp may include first and second interlayer insulating layers 111 and 112 and first and second sacrificial layers 121 and 122, which are alternatively stacked on the lower semiconductor layer 103. The first and second sacrificial layers 121 and 122 may be formed of or include an insulating material different from the first and second interlayer insulating layers 111 and 112. The first and second sacrificial layers 121 and 122 may be formed of a material that can be etched with an etch selectivity with respect to (e.g., faster than) the first and second interlayer insulating layers 111 and 112. For example, the first and second sacrificial layers 121 and 122 may be formed of or include silicon nitride and may or may not include silicon oxide, and the first and second interlayer insulating layers 111 and 112 may be formed of or include silicon oxide and may or may not include silicon nitride. In some example embodiments, the first and second sacrificial layers 121 and 122 may have substantially the same thickness, and thicknesses of the first and second interlayer insulating layers 111 and 112 may vary depending on their vertical position.

A trimming process may be performed on the preliminary stack STp, which includes the first and second interlayer insulating layers 111 and 112 and the first and second sacrificial layers 121 and 122 that are alternately stacked. The trimming process may include forming a mask pattern on the cell array region CAR and the cell contact region EXR to cover a portion of a top surface of the preliminary stack STp, patterning the preliminary stack STp using the mask pattern, reducing an area of the mask pattern, and patterning the preliminary stack STp using the mask pattern having the reduced area. In some example embodiments, the steps of reducing the area of the mask pattern and patterning the preliminary stack STp using the mask pattern may be repeated several times during the trimming process. As a result of the trimming process, at least a portion of each of the first and second interlayer insulating layers 111 and 112 may be exposed to the outside, and the preliminary stack STp may be formed to have a staircase structure on the cell contact region EXR.

The fourth insulating layer 60 may be formed to cover the staircase structure of the preliminary stack STp. The fourth insulating layer 60 may cover all or at least a portion of the second substrate 100 and at least a portion of the carrier substrate CRS. A top surface of the fourth insulating layer 60 may be substantially coplanar with a top surface of the topmost one of the second interlayer insulating layers 112 of the preliminary stack STp.

The vertical channel holes CH may be formed to penetrate the layers (e.g., the first and second interlayer insulating layers 111 and 112 and the first and second sacrificial layers 121 and 122) of the preliminary stack STp, the lower semiconductor layer 103, the lower sacrificial layer 101, and at least a portion of the second substrate 100, and in this case, the vertical channel holes CH may have a high aspect ratio. The vertical channel holes CH may be formed to further penetrate the fourth insulating layer 60 in the cell contact region EXR.

The vertical channel holes CH may include the first vertical channel holes CH1, which are provided to penetrate the first interlayer insulating layers 111 and the first sacrificial layers 121, and the second vertical channel holes CH2, which are provided to penetrate the second interlayer insulating layers 112 and the second sacrificial layers 122. The second vertical channel holes CH2 may overlap with the first vertical channel holes CH1 in the third direction D3 and may be connected to the first vertical channel holes CH1.

The first vertical channel structures VS1 may be formed in the vertical channel holes CH of the cell array region CAR. The second vertical channel structures VS2 may be formed in the vertical channel holes CH of the cell contact region EXR.

The formation of each of the first and second vertical channel structures VS1 and VS2 may include forming the data storage pattern DSP and the vertical semiconductor pattern VSP to cover, e.g. to conformally cover an inner side surface of each of the vertical channel holes CH, forming the gapfill insulating pattern VI to fill a remaining space of the vertical semiconductor pattern VSP, and forming the conductive pad PAD in a space enclosed by the gapfill insulating pattern VI and the data storage pattern DSP. The first and second vertical channel structures VS1 and VS2 may have top surfaces that are substantially coplanar with the top surface of the topmost one of the second interlayer insulating layers 112 and the top surface of the fourth insulating layer 60.

Figure 10A:
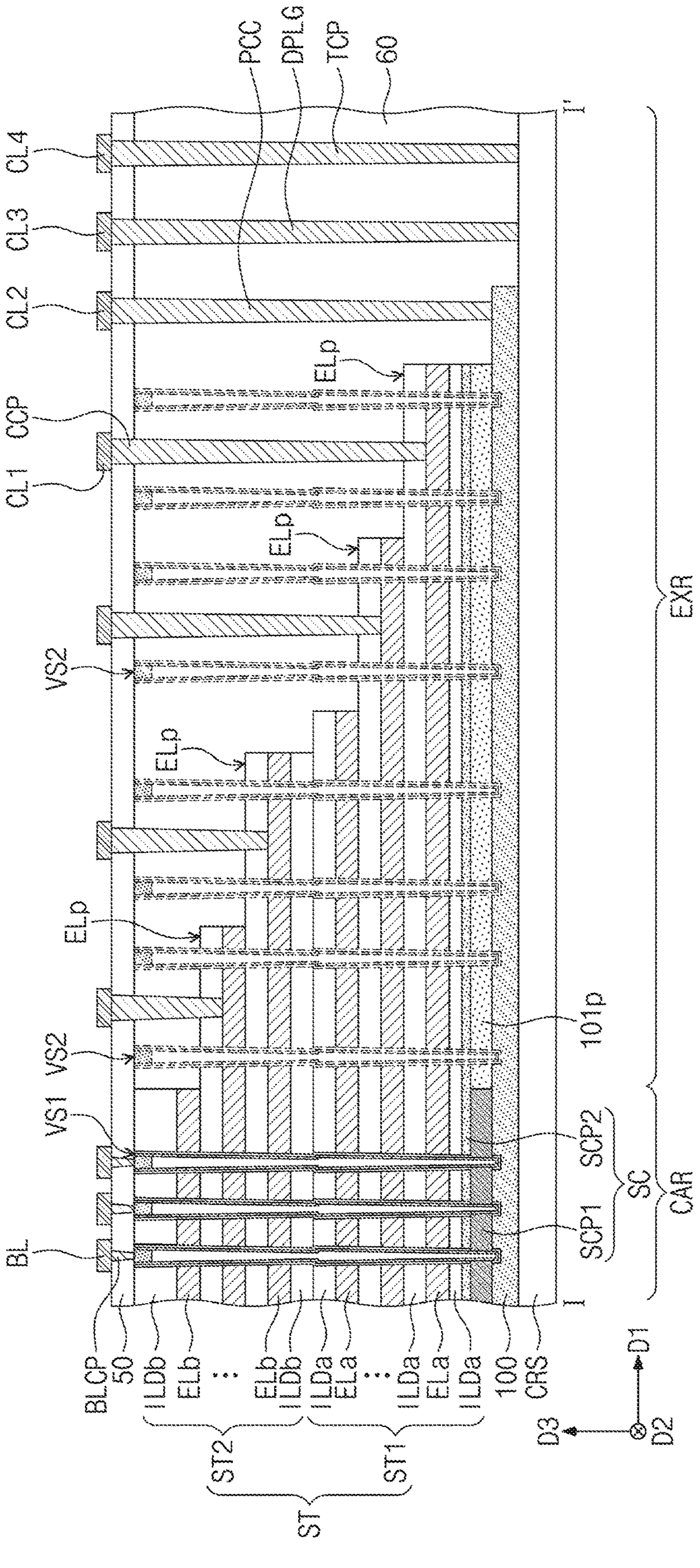
Figure 10B:
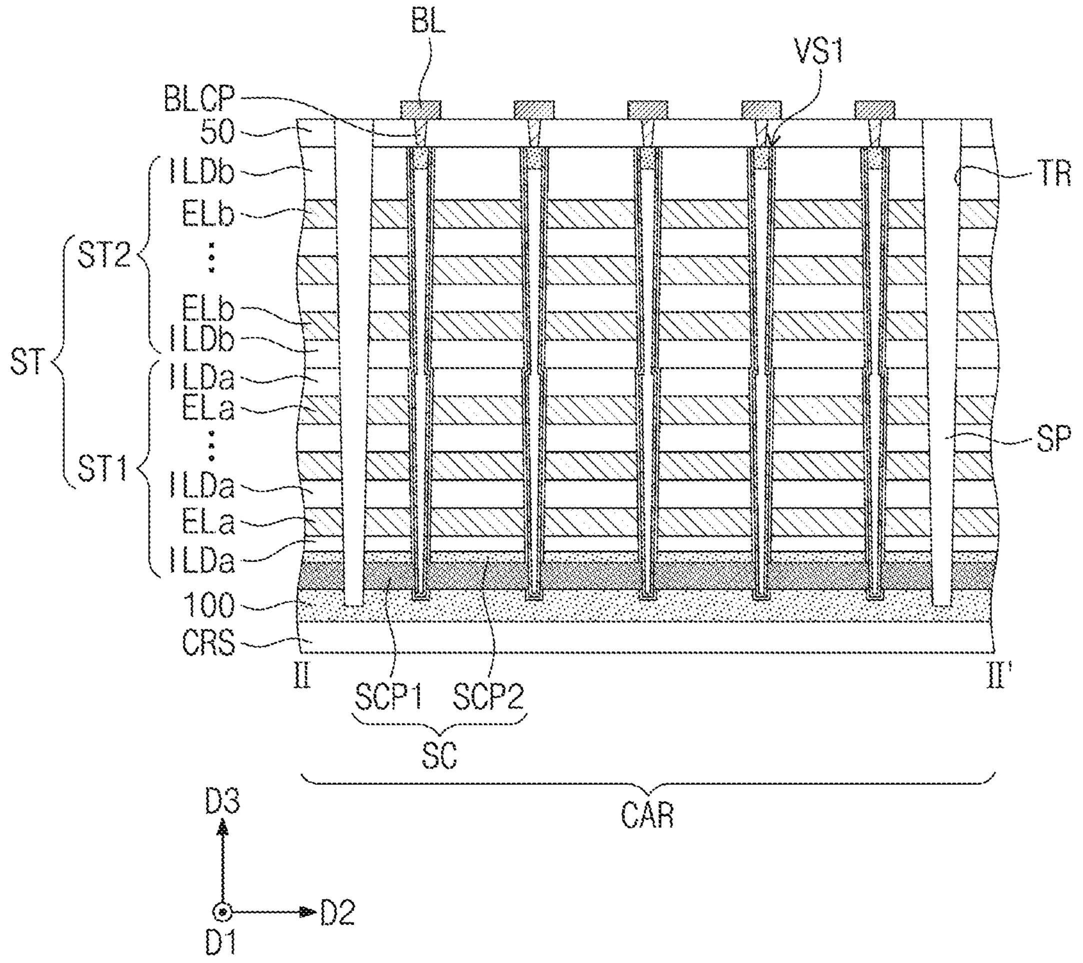

Referring to FIGS. 10A and 10B, the third insulating layer 50 may be formed to cover the top surface of the topmost one of the second interlayer insulating layers 112 and the top surface of the fourth insulating layer 60.

The trench TR may be formed to penetrate the third insulating layer 50, the preliminary stack STp, the lower semiconductor layer 103, the lower sacrificial layer 101, and at least a portion of the second substrate 100. The trench TR may be extended from the cell array region CAR to the cell contact region EXR. A bottom surface of the trench TR may be located at a level that is lower than bottom surfaces of the first and second vertical channel structures VS1 and VS2.

The first and second sacrificial layers 121 and 122 and a portion of the lower sacrificial layer 101 may be removed through the trench TR. In some example embodiments, the removal process may be performed to remove only a portion of the lower sacrificial layer 101, which is placed in the cell array region CAR. A remaining portion of the lower sacrificial layer 101, which is placed in the cell contact region EXR and is not removed by the removal process, may be referred to as the dummy insulating pattern 101*p*. The removal process may include a wet etching process that is performed using solution containing, for example, hydrofluoric acid (HF) and/or phosphoric acid ($H_3PO_4$); however, example embodiments are not limited thereto, and the removal process may alternatively or additionally including a dry etching process in some example embodiments.

During the partial removal of the lower sacrificial layer 101, a portion of the data storage pattern DSP of the first vertical channel structure VS1, which is exposed through empty spaces formed by the partial removal of the lower sacrificial layer 101, may be removed together with the lower sacrificial layer 101.

The first source conductive pattern SCP1 may be formed to fill the empty space formed by removing the lower sacrificial layer 101. The first source conductive pattern SCP1 may be in contact with the vertical semiconductor pattern VSP of each of the first vertical channel structures VS1. By contrast, the first source conductive pattern SCP1 may not be in contact with the vertical semiconductor pattern VSP of each of the second vertical channel structures VS2. In some example embodiments, the first source conductive pattern SCP1 may be formed of or include at least one of doped semiconductor materials. Although not shown, an air gap may be formed in the first source conductive pattern SCP1. The lower semiconductor layer 103 may be referred to as the second source conductive pattern SCP2, and the source structure SC including the first and second source conductive patterns SCP1 and SCP2 may be formed.

The first and second gate electrodes ELa and ELb may be formed to fill empty regions formed by removing the first and second sacrificial layers 121 and 122. The first and second interlayer insulating layers 111 and 112 may be referred to as the first and second interlayer insulating layers ILDa and ILDb of the first and second stacks ST1 and ST2, and as a result, the stack ST including the first and second interlayer insulating layers ILDa and ILDb and the first and second gate electrodes ELa and ELb may be formed.

The separation pattern SP may be formed to fill the trench TR. A top surface of the separation pattern SP may be substantially coplanar with a top surface of the third insulating layer 50.

The bit line contact plugs BLCP may be formed on the cell array region CAR to penetrate the third insulating layer 50 and to be in contact with top surfaces of the first vertical channel structures VS1. The cell contact plugs CCP may be formed on the cell contact region EXR to penetrate the third and fourth insulating layers 50 and 60 and to be in contact with the pad portions ELp of the first and second gate electrodes ELa and ELb. Each of the cell contact plugs CCP may be formed to penetrate at least a portion of a corresponding one of the first and second interlayer insulating layers ILDa and ILDb. The substrate contact plug PCC may be formed on the cell contact region EXR to penetrate the third and fourth insulating layers 50 and 60 and to be in contact with the second substrate 100. The dummy plug DPLG and the penetration contact plug TCP may be formed on the cell contact region EXR to penetrate the third and fourth insulating layers 50 and 60 and to be in contact with a top surface of the carrier substrate CRS. The dummy plug DPLG and the penetration contact plug TCP may be spaced apart from the stack ST and the outermost one of the cell contact plugs CCP. The dummy plug DPLG and the penetration contact plug TCP may be spaced apart from each other.

On the cell array region CAR, the bit lines BL may be formed on the third insulating layer 50 to be in contact with the bit line contact plugs BLCP. On the cell contact region EXR, the first to fourth conductive lines CL1, CL2, CL3, and CL4 may be formed on the third insulating layer 50 to be in contact with the cell contact plugs CCP, the substrate contact plug PCC, the dummy plug DPLG, and the penetration contact plug TCP, respectively.

Figure 11A:
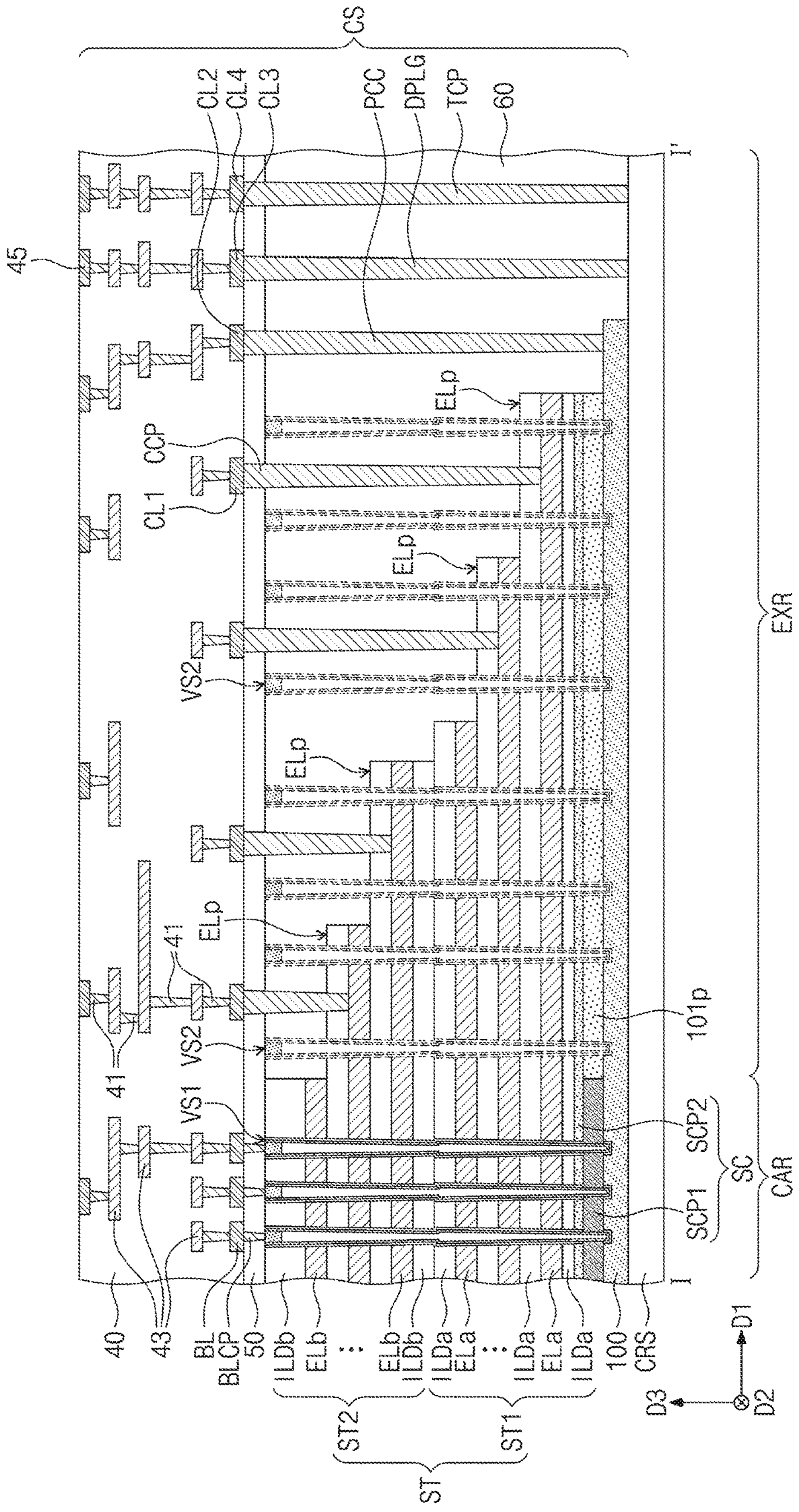
Figure 11B:
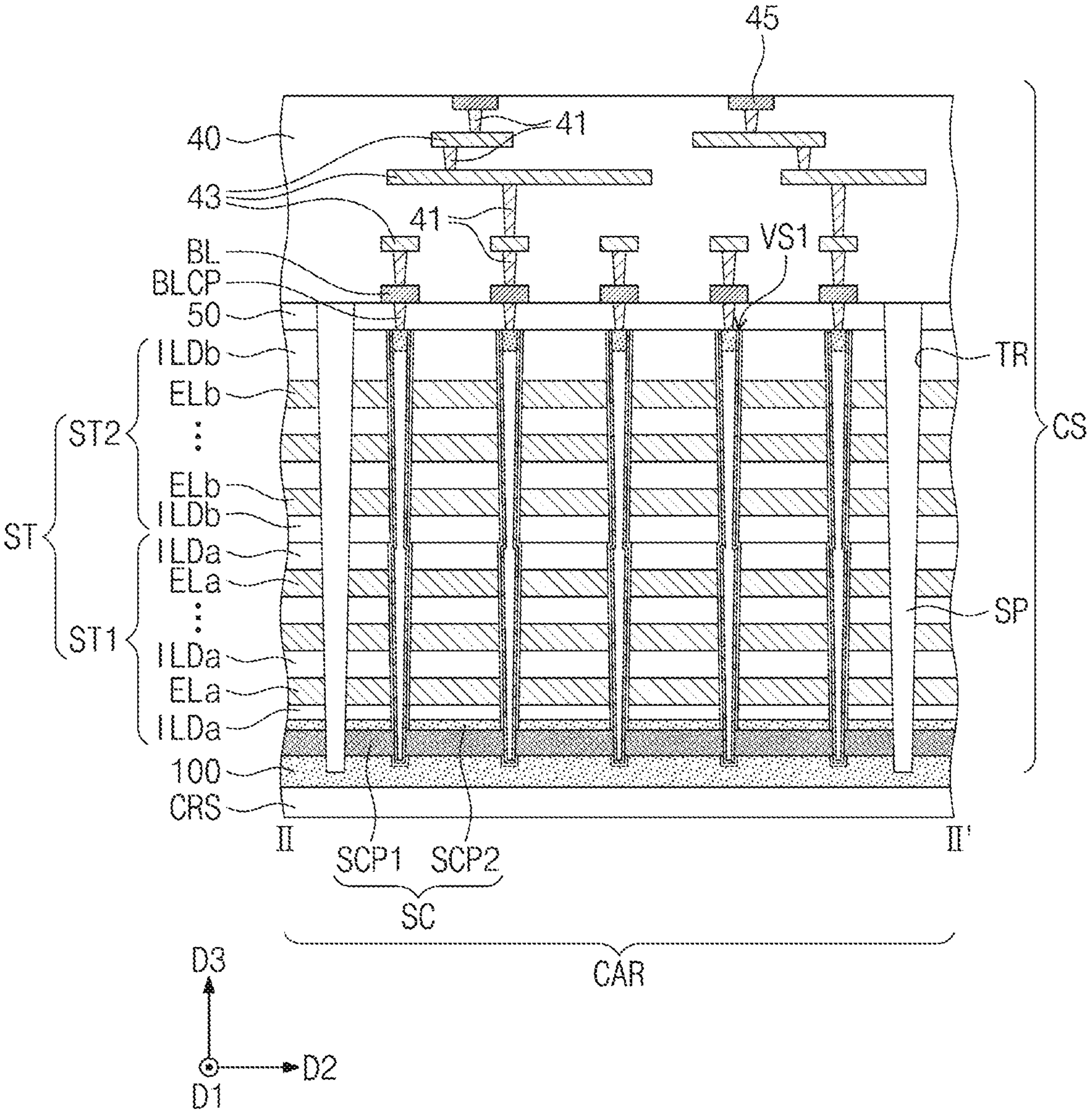

Referring to FIGS. 11A and 11B, the connection contact plugs 41, the connection circuit interconnection lines 43, the second bonding pads 45, and the second insulating layer 40 covering them may be formed on the third insulating layer 50, and here, the connection contact plugs 41, the connection circuit interconnection lines 43, the second bonding pads 45 may be electrically connected to the bit lines BL, the first to fourth conductive lines CL1, CL2, CL3, and CL4. The second bonding pads 45 may be formed to have top surfaces that are substantially coplanar with the top surface of the second insulating layer 40. The cell array structure CS may be formed on the carrier substrate CRS by the method described with reference to FIGS. 8A to 11B.

Figure 12A:
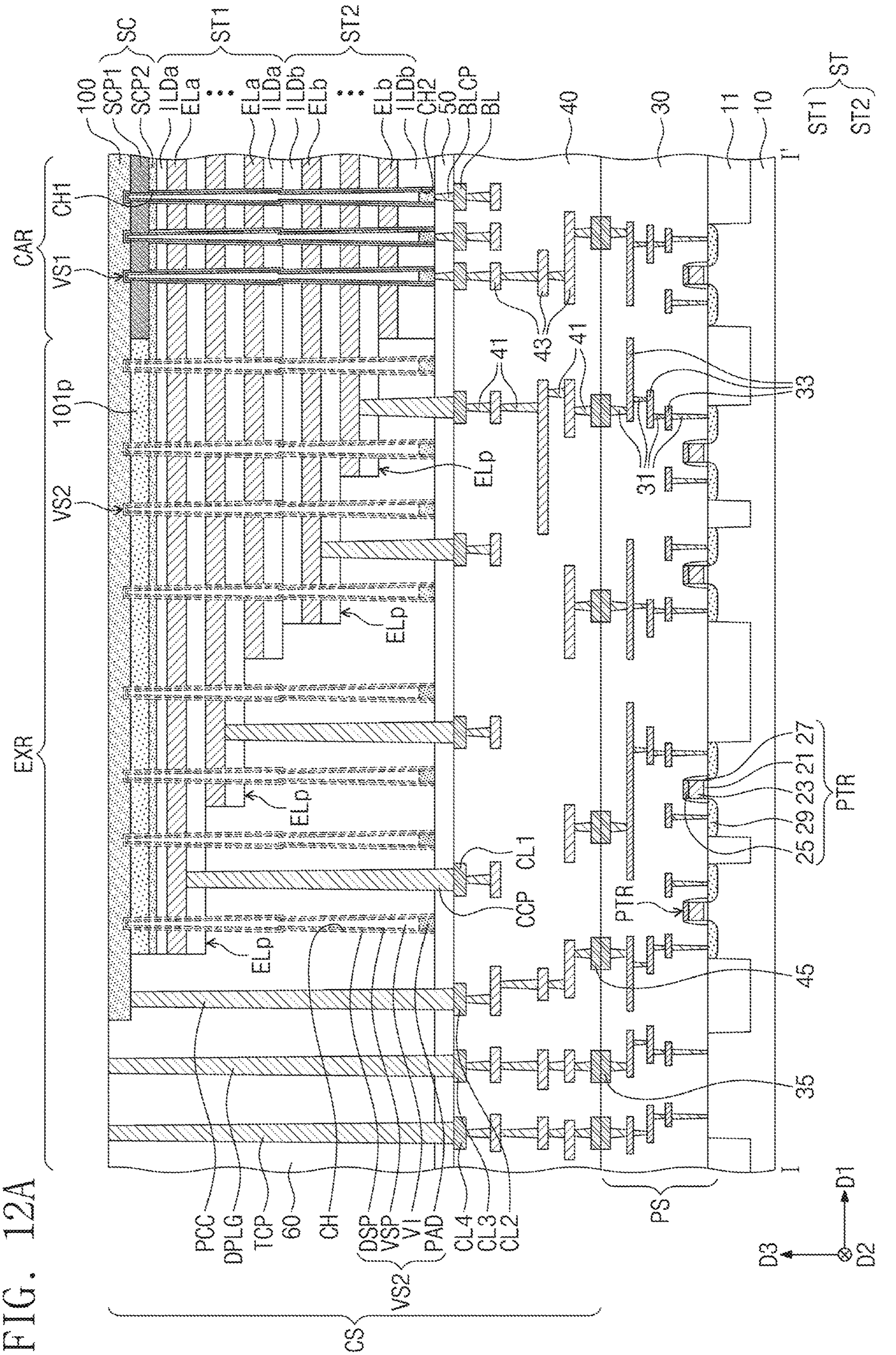
Figure 12B:
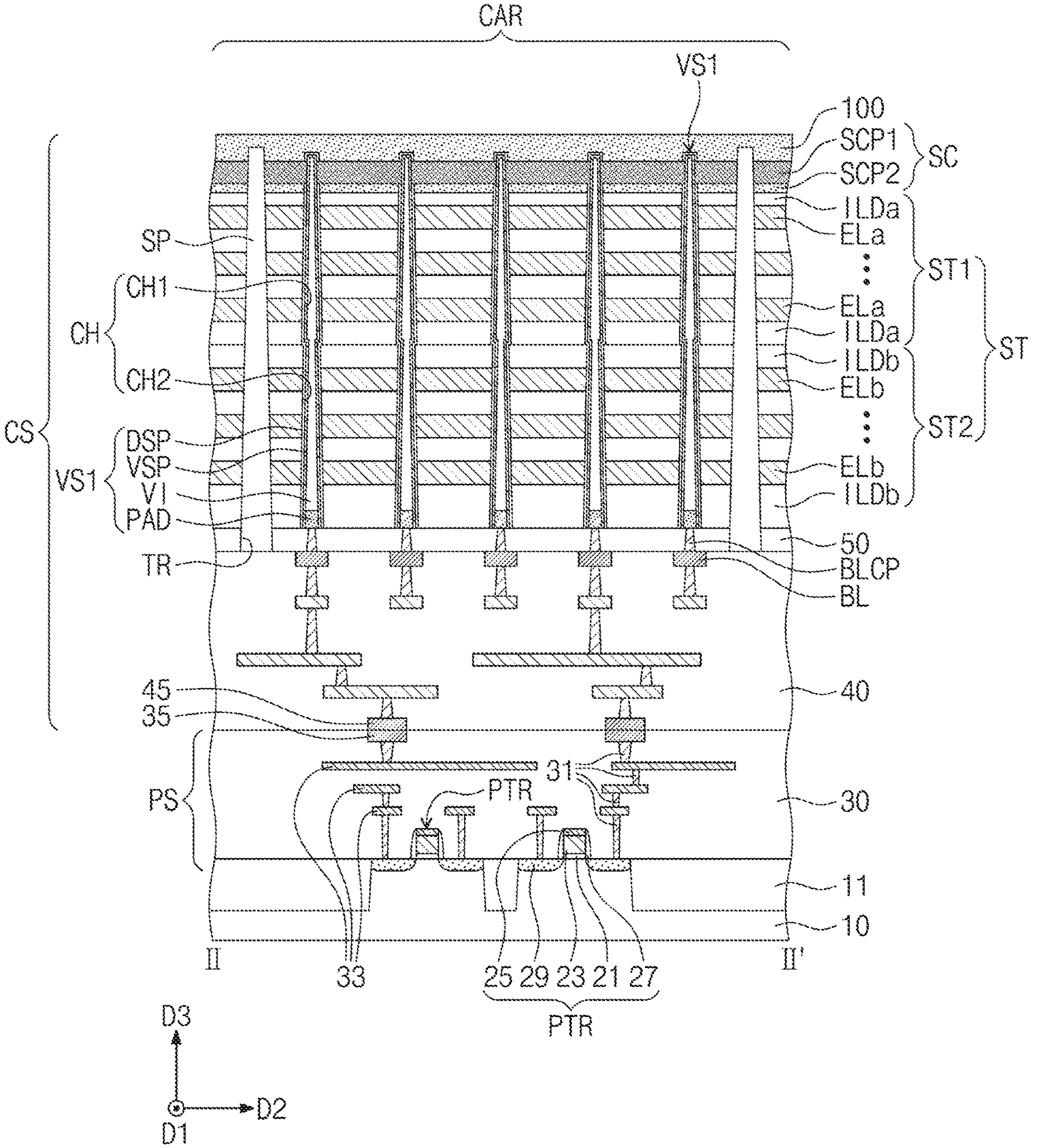

Referring to FIGS. 12A and 12B, the cell array structure CS, which is formed on the carrier substrate CRS, may be bonded to the peripheral circuit structure PS, which is formed on the first substrate 10 by the method described with reference to FIGS. 8A and 8B. The carrier substrate CRS may be placed on the first substrate 10 such that the cell array structure CS faces the peripheral circuit structure PS. The first bonding pads 35 of the peripheral circuit structure PS may be provided to be in contact with and then may be bonded to the second bonding pads 45 of the cell array structure CS. After the bonding of the first and second bonding pads 35 and 45, the carrier substrate CRS on the cell array structure CS may be removed.

Referring back to FIGS. 5, 6A, and 6B, the fifth insulating layer 80 may be formed on the second substrate 100 and the fourth insulating layer 60. The input/output pad IOP may be formed to penetrate the fifth insulating layer 80 and to be connected to the penetration contact plug TCP. The input/output pad IOP may be electrically connected to the fourth conductive line CL4 through the penetration contact plug TCP and moreover may be electrically connected to at least one of the peripheral transistors PTR of the peripheral circuit structure PS. A portion of the input/output pad IOP may protrude above the top surface of the fifth insulating layer 80, but the inventive concept is not limited to this example.

Figure 13:
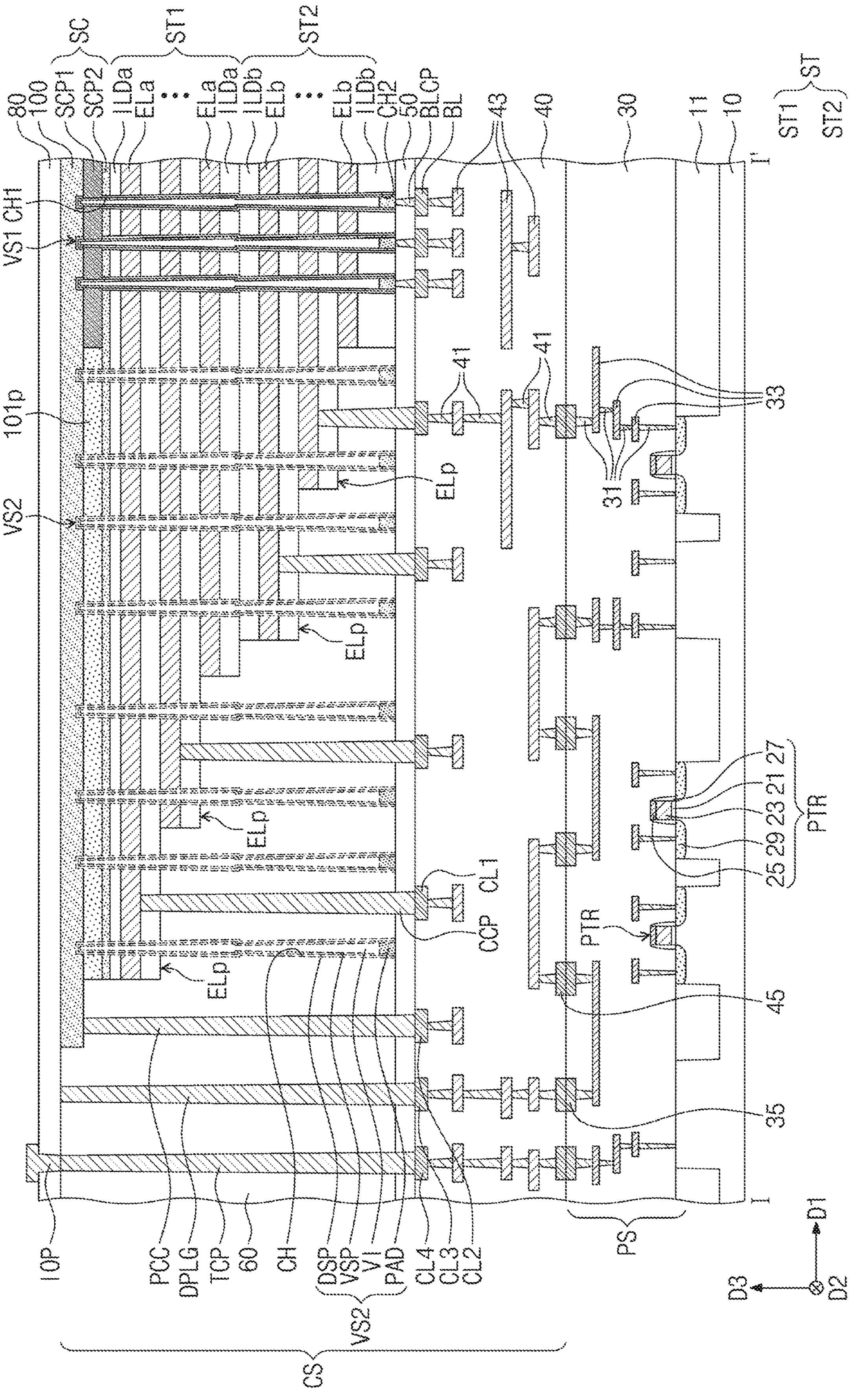
FIG. 13 is a sectional view, which is taken along the line I-f of FIG. 5 to illustrate a three-dimensional semiconductor memory device according to various example embodiments.

FIG. 13 is a sectional view, which is taken along the line I-f of FIG. 5 to illustrate a three-dimensional semiconductor memory device according to various example embodiments. In the following description, an element previously described with reference to FIGS. 5, 6A, and 6B may be identified by the same reference number without repeating an overlapping description thereof, for concise description.

Referring to FIG. 13, the dummy plug DPLG may be connected to the first bonding pads 35 and the second bonding pads 45. One first bonding pad 35 and one second bonding pad 45, which are connected to the dummy plug DPLG described with reference to FIGS. 5, 6A, and 6B, may be connected to others of the first and second bonding pads 35 and 45 through the peripheral contact plugs 31, the peripheral circuit interconnection lines 33, the connection contact plugs 41, and the connection circuit interconnection lines 43. One of the first bonding pads 35 connected to the dummy plug DPLG may be connected to the first substrate 10 through the peripheral contact plugs 31 and the peripheral circuit interconnection lines 33. The dummy plug DPLG may be grounded to the first substrate 10 through the first bonding pads 35 and the second bonding pads 45.

Figure 14:
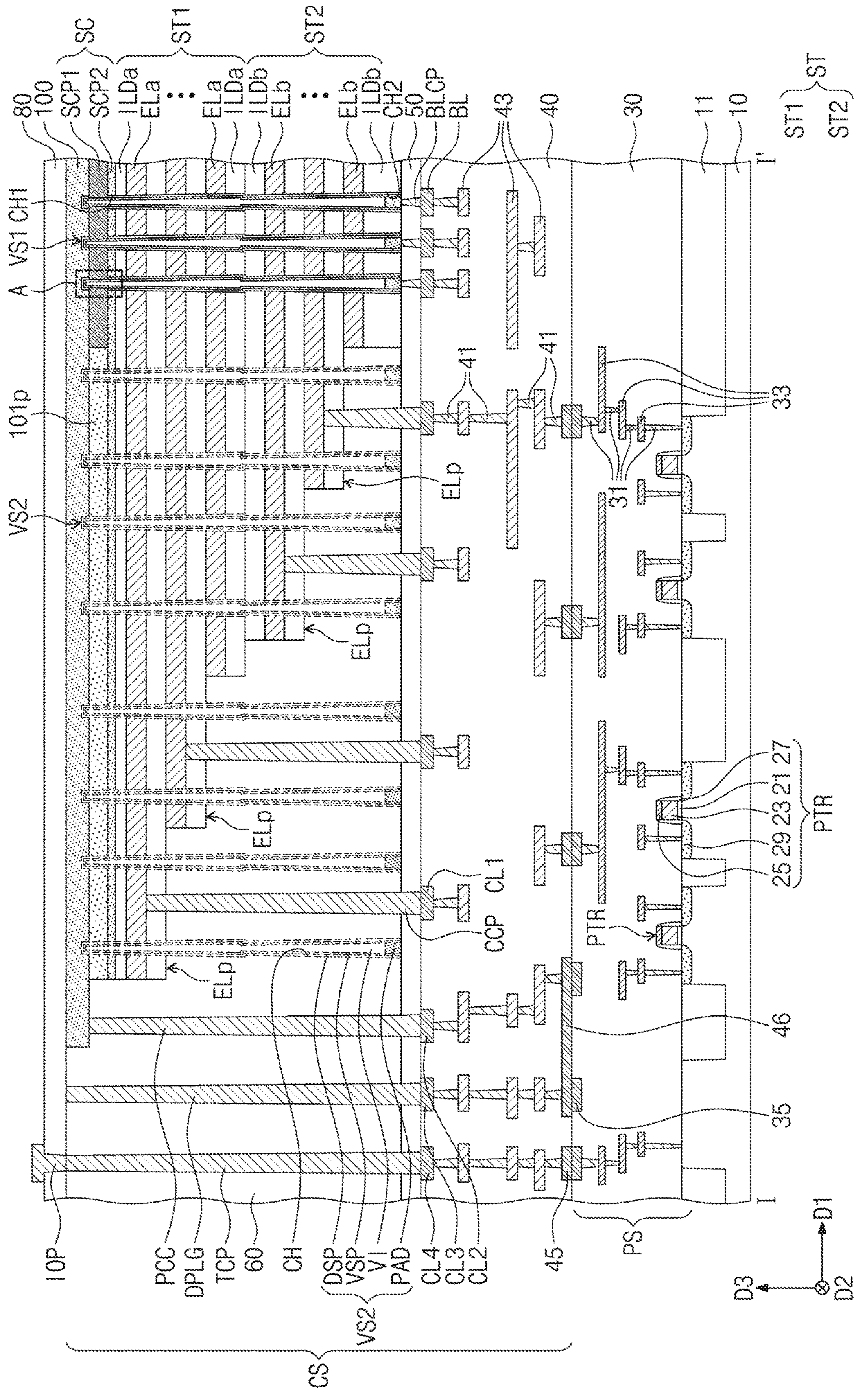
FIG. 14 is a sectional view, which is taken along the line I-f of FIG. 5 to illustrate a three-dimensional semiconductor memory device according to various example embodiments.

FIG. 14 is a sectional view, which is taken along the line I-I' of FIG. 5 to illustrate a three-dimensional semiconductor memory device according to various example embodiments. In the following description, an element previously described with reference to FIGS. 5, 6A, and 6B may be identified by the same reference number without repeating an overlapping description thereof, for concise description.

Referring to FIG. 14, a third bonding pad 46 may be provided on a bottom surface of the second insulating layer 40. The dummy plug DPLG may be connected to not one second bonding pad 45 but the third bonding pad 46. In detail, the dummy plug DPLG may be connected to the third bonding pad 46 through the third conductive line CL3, the connection contact plugs 41, and the connection circuit interconnection lines 43. The second insulating layer 40 may not cover a bottom surface of the third bonding pad 46. The third bonding pad 46 may be extended in the first or second direction D1 or D2 and may be in contact with a plurality of the first bonding pads 35. The first bonding pads 35, which are in contact with the third bonding pad 46, may not be connected to the first substrate 10. For example, the dummy plug DPLG may not be grounded to or may be floating with respect to the first substrate 10.

The substrate contact plug PCC may be connected to the third bonding pad 46 through the second conductive line CL2, the connection contact plugs 41, and the connection circuit interconnection lines 43. The substrate contact plug PCC may be connected to the second substrate 100. Thus, the dummy plug DPLG and the substrate contact plug PCC may be connected to each other, and the dummy plug DPLG may be connected to the second substrate 100. For example, the dummy plug DPLG may be connected to or grounded to the second substrate 100.

The dummy plug DPLG may not be connected to other conductive elements, except for the second substrate 100, the substrate contact plug PCC, the second conductive line CL2, the third conductive line CL3, the connection contact plugs 41, the connection circuit interconnection lines 43, the first bonding pads 35, and the third bonding pad 46. The substrate contact plug PCC may not be connected to other conductive elements, except for the second substrate 100, the dummy plug DPLG, the second conductive line CL2, the third conductive line CL3, the connection contact plugs 41, the connection circuit interconnection lines 43, the first bonding pads 35, and the third bonding pad 46. Thus, there may be only one electrical path that is connected from the dummy plug DPLG to the second substrate 100 through the substrate contact plug PCC.

A three-dimensional semiconductor memory device according to various example embodiments may include the dummy plug DPLG, which is grounded to the second substrate 100 through the third conductive line CL3, the connection contact plugs 41, the connection circuit interconnection lines 43, the third bonding pad 46, and the substrate contact plug PCC. Here, by performing an electron beam inspection on the dummy plug DPLG, it may be possible to examine and/or determine whether there is an inner defect (e.g., a crack) in the first bonding pads 35 and the third bonding pad 46 connected to the dummy plug DPLG. Since the dummy plug DPLG is connected to the substrate contact plug PCC adjacent thereto and is grounded to the second substrate 100, a length of an electrical path may be reduced, and in this case, the process time for the electron beam inspection may be shortened. Thus, it may be possible to fabricate the three-dimensional semiconductor memory device cost-effectively.

Alternatively or additionally, since a device with an inner defect can be filtered and excluded during the fabrication process, the electrical and/or reliability characteristics of the three-dimensional semiconductor memory device may be improved.

Figure 15:
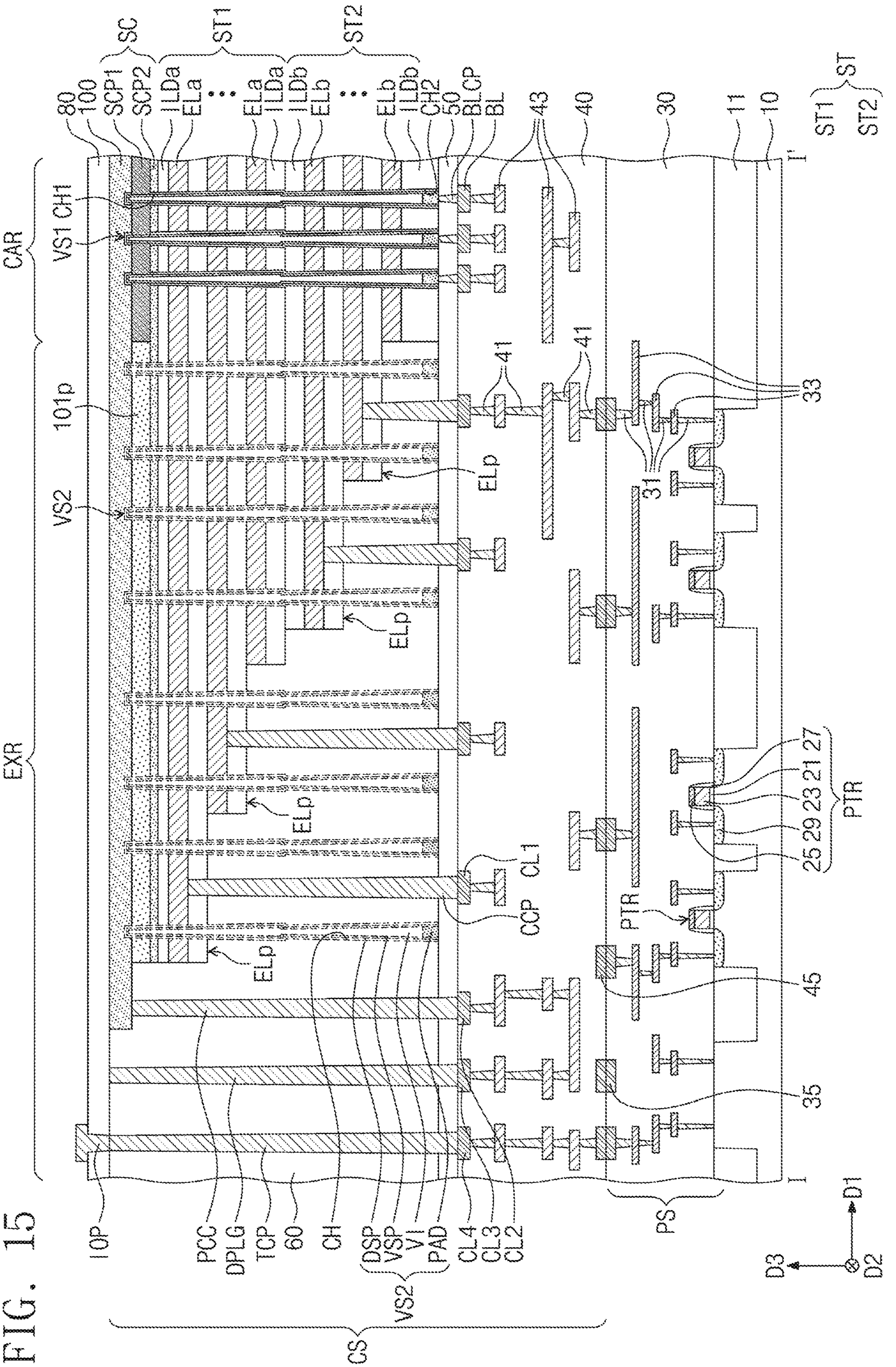
FIG. 15 is a sectional view, which is taken along the line I-f of FIG. 5 to illustrate a three-dimensional semiconductor memory device according to various example embodiments.

FIG. 15 is a sectional view, which is taken along the line I-f of FIG. 5 to illustrate a three-dimensional semiconductor memory device according to various example embodiments. In the following description, an element previously described with reference to FIGS. 5, 6A, and 6B may be identified by the same reference number without repeating an overlapping description thereof, for concise description.

Referring to FIG. 15, the dummy plug DPLG may be connected to the substrate contact plug PCC through the third conductive line CL3, the connection contact plugs 41, the connection circuit interconnection lines 43, and the second conductive line CL2. The dummy plug DPLG and the substrate contact plug PCC may not be connected to the first and second bonding pads 35 and 45. The substrate contact plug PCC may be connected to the second substrate 100. That is, the dummy plug DPLG may be grounded to the second substrate 100.

The dummy plug DPLG may not be connected to other conductive elements, except for the second substrate 100, the substrate contact plug PCC, the second conductive line CL2, the third conductive line CL3, the connection contact plugs 41, and the connection circuit interconnection lines 43. The substrate contact plug PCC may not be connected to other conductive elements, except for the second substrate 100, the dummy plug DPLG, the second conductive line CL2, the third conductive line CL3, the connection contact plugs 41, and the connection circuit interconnection lines 43. Thus, there may be only one electrical path that is connected from the dummy plug DPLG to the second substrate 100 through the substrate contact plug PCC.

A three-dimensional semiconductor memory device according to various example embodiments may include the dummy plug DPLG, which is grounded to the second substrate 100 through the third conductive line CL3, the connection contact plugs 41, the connection circuit interconnection lines 43, and the substrate contact plug PCC. Here, by performing an electron beam inspection on the dummy plug DPLG, it may be possible to examine whether there is an inner defect (e.g., a crack) in the connection contact plugs 41, the connection circuit interconnection lines 43, and the substrate contact plug PCC connected to the dummy plug DPLG. Since the dummy plug DPLG is not connected to the first and second bonding pads 35 and 45 and is directly connected to the substrate contact plug PCC through the connection contact plugs 41 and the connection circuit interconnection lines 43, a length of an electrical path may be reduced, and in this case, the process time for the electron beam inspection may be shortened. Accordingly, it may be possible to fabricate the three-dimensional semiconductor memory device in a more cost-effective manner.

Alternatively or additionally, since a device with an inner defect can be filtered and excluded during the fabrication process, the electrical and reliability characteristics of the three-dimensional semiconductor memory device may be improved.

Figure 16:
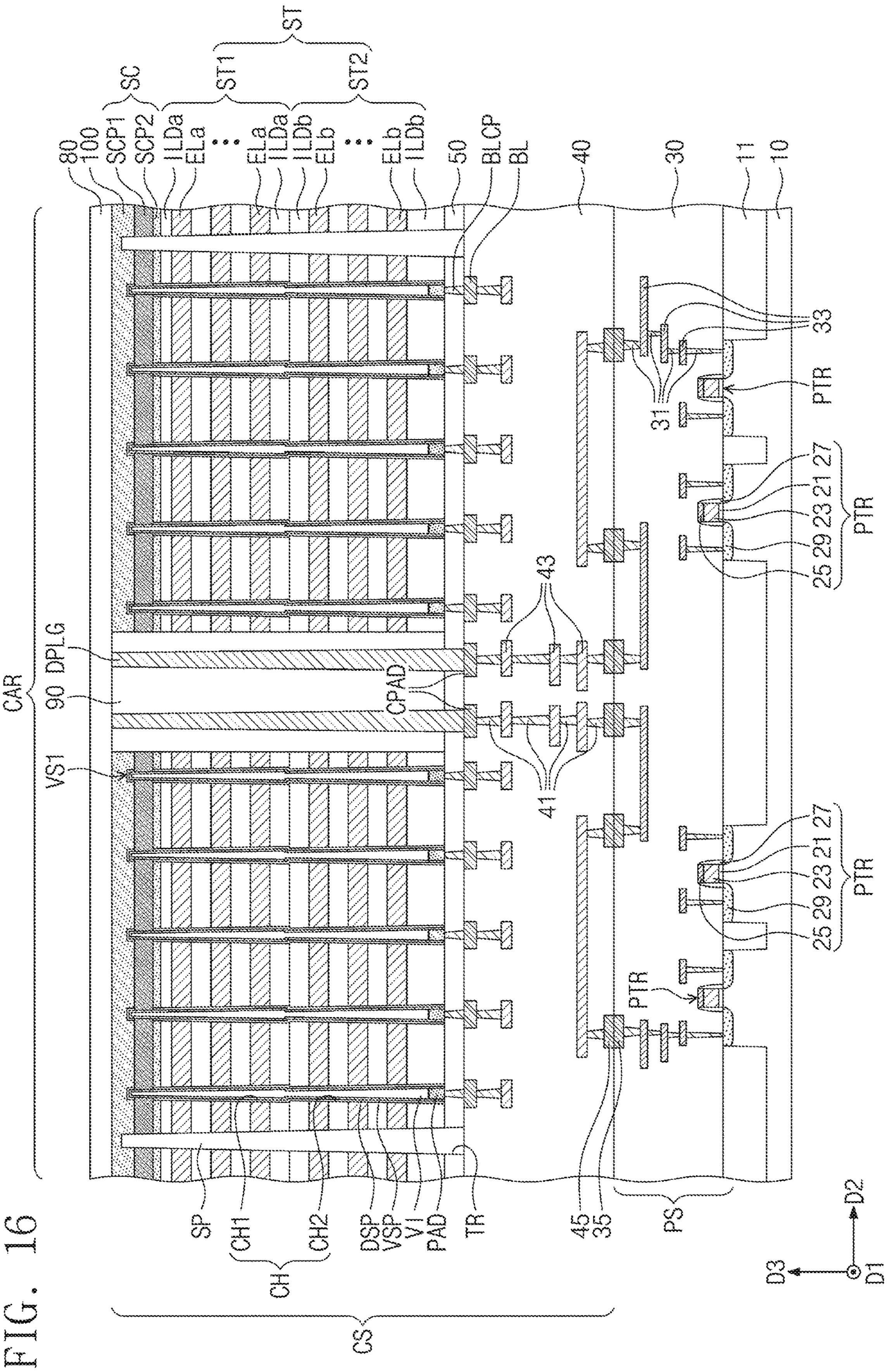
FIG. 16 is a sectional view illustrating a three-dimensional semiconductor memory device according to various example embodiments.

FIG. 16 is a sectional view illustrating a three-dimensional semiconductor memory device according to various example embodiments. In detail, FIG. 16 corresponds to a section of the cell array region CAR, which is perpendicular to the first direction D1 (e.g., see FIG. 6B). In the following description, an element previously described with reference to FIGS. 5, 6A, and 6B may be identified by the same reference number without repeating an overlapping description thereof, for concise description.

Referring to FIG. 16, a sixth insulating layer 90 may be provided on the cell array region CAR to penetrate the stack ST. The fifth and sixth insulating layers 80 and 90 may be independently formed by separate processes or may be formed to constitute a single object (e.g., by the same process). A top surface of the sixth insulating layer 90 may be coplanar with a top surface of the second substrate 100. A bottom surface of the sixth insulating layer 90 may be coplanar with a bottom surface of the bottommost one of the second interlayer insulating layers ILDb. The sixth insulating layer 90 may have a circular or polygonal shape or may have a line shape extending in the first direction D1, when viewed in a plan view. The sixth insulating layer 90 may have a single-layered structure or may have a multi-layered structure including a plurality of insulating layers. For example, the sixth insulating layer 90 may be formed of or include at least one of silicon oxide, silicon nitride, silicon oxynitride, and/or low-k dielectric materials. Although not shown, the sixth insulating layer 90 may include insulating layers and sacrificial layers, which are alternatingly stacked on the third insulating layer 50. The insulating layers may be formed of or include at least one of silicon oxide, silicon nitride, silicon oxynitride, and/or low-k dielectric materials. The sacrificial layers may be formed of or include silicon nitride or silicon oxynitride. Although not shown, a dam structure, which is formed of or includes an insulating material, may be additionally provided to enclose the sixth insulating layer 90. The presence or absence of the dam structure may vary depending on a desired design of a three-dimensional semiconductor memory device.

The dummy plug DPLG on the cell contact region EXR may be omitted and may be provided on the cell array region CAR. In some example embodiments, a plurality of dummy plugs DPLG may be provided and may be provided on each of the cell contact region EXR and the cell array region CAR. The dummy plug DPLG may be provided to penetrate the sixth insulating layer 90 and the third insulating layer 50. A top surface of the dummy plug DPLG may be coplanar with the top surface of the sixth insulating layer 90 and the top surface of the second substrate 100. A bottom surface of the dummy plug DPLG may be coplanar with the bottom surface of the third insulating layer 50. The dummy plug DPLG may be spaced apart from the stack ST in the first or second direction D1 or D2.

A contact pad CPAD may be provided in an upper portion of the second insulating layer 40 and may be overlapped with the dummy plug DPLG. The second insulating layer 40 may be provided to expose a top surface of the contact pad CPAD. The dummy plug DPLG may be in contact with the contact pad CPAD and may be connected to the contact pad CPAD. The contact pad CPAD may be formed of or include at least one of conductive materials (e.g., metallic materials).

The contact pad CPAD may be connected to the second bonding pads 45 through the connection contact plugs 41 and the connection circuit interconnection lines 43. The first bonding pads 35 may be connected to the second bonding pads 45, which are connected to the contact pad CPAD. The first bonding pads 35 may be connected to each other through the peripheral contact plugs 31 and the peripheral circuit interconnection lines 33. The second bonding pads 45 may be connected to each other through the connection contact plugs 41 and the connection circuit interconnection lines 43. One of the first bonding pads 35 may be connected to the first substrate 10 through the peripheral contact plugs 31 and the peripheral circuit interconnection lines 33. Thus, the dummy plug DPLG may be connected to the first substrate 10 through the contact pad CPAD, the connection contact plugs 41, the connection circuit interconnection lines 43, the second bonding pads 45, the first bonding pads 35, the peripheral contact plugs 31, and the peripheral circuit interconnection lines 33. For example, the dummy plug DPLG may be grounded to the first substrate 10. Thus, there may be only one electrical path that is connected from the dummy plug DPLG to the first substrate 10.

Figure 17:
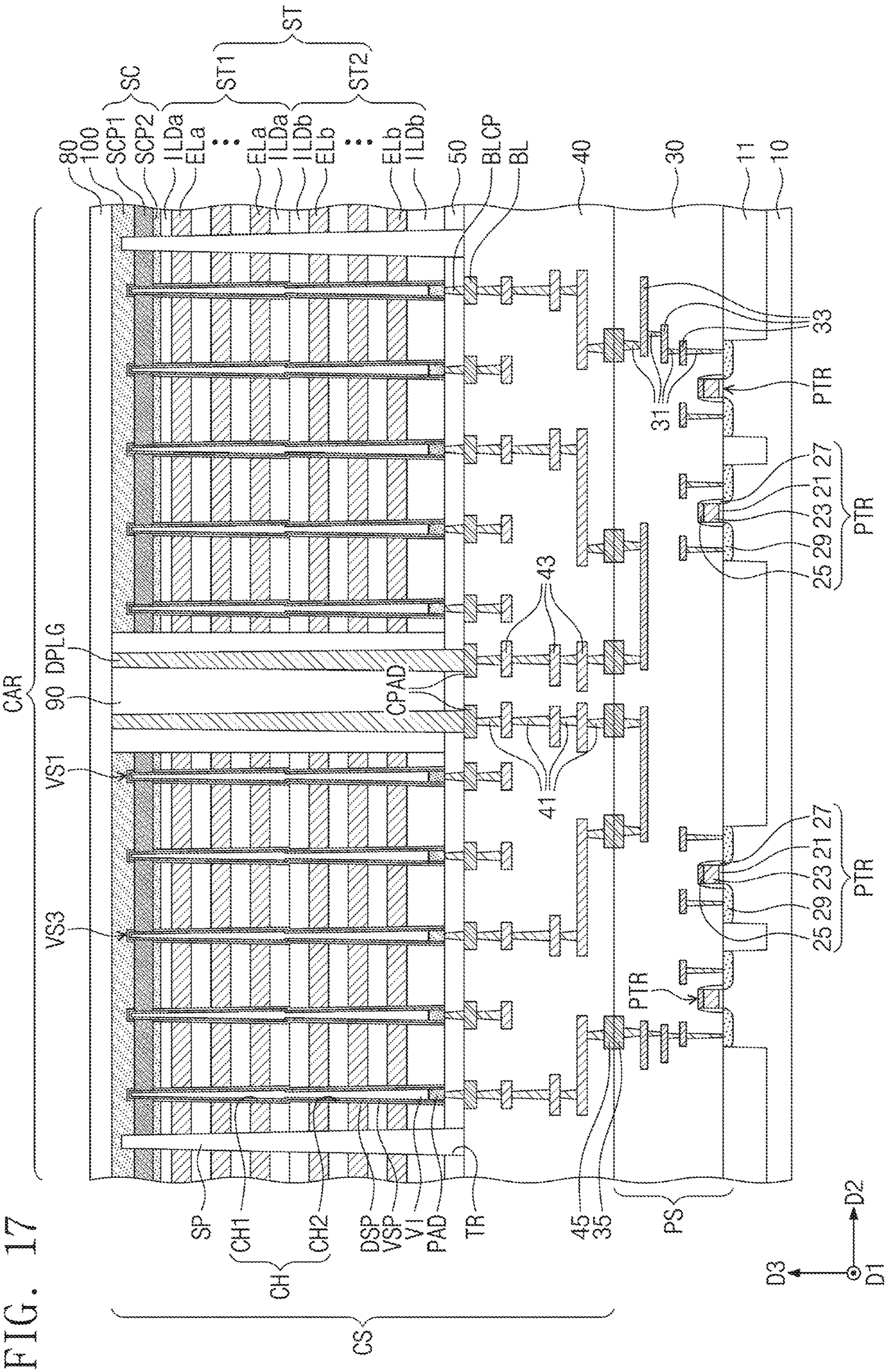
FIG. 17 is a sectional view illustrating a three-dimensional semiconductor memory device according to various example embodiments.

FIG. 17 is a sectional view illustrating a three-dimensional semiconductor memory device according to various example embodiments. In detail, FIG. 17 corresponds to a section of the cell array region CAR, which is perpendicular to the first direction D1 (e.g., see FIG. 6B). In the following description, an element previously described with reference to FIGS. 5, 6A, and 6B may be identified by the same reference number without repeating an overlapping description thereof, for concise description.

Referring to FIG. 17, the sixth insulating layer 90 may be provided on the cell array region CAR to penetrate the stack ST. The fifth and sixth insulating layers 80 and 90 may be independently formed by separate processes or may be formed to constitute a single object (e.g., by the same process). The top surface of the sixth insulating layer 90 may be coplanar with the top surface of the second substrate 100. The bottom surface of the sixth insulating layer 90 may be coplanar with a bottom surface of the bottommost one of the second interlayer insulating layers ILDb. The sixth insulating layer 90 may have a circular or polygonal shape or may have a line shape extending in the first direction D1, when viewed in a plan view. The sixth insulating layer 90 may have a single-layered structure or may have a multi-layered structure including a plurality of insulating layers. For example, the sixth insulating layer 90 may be formed of or include at least one of silicon oxide, silicon nitride, silicon oxynitride, and/or low-k dielectric materials. In some example embodiments, although not shown, the sixth insulating layer 90 may include insulating layers and sacrificial layers, which are alternatingly stacked on the third insulating layer 50. The insulating layers may be formed of or include at least one of silicon oxide, silicon nitride, silicon oxynitride, and/or low-k dielectric materials. The sacrificial layers may be formed of or include silicon nitride or silicon oxynitride. Although not shown, a dam structure may be additionally provided to enclose the sixth insulating layer 90. The presence or absence of the dam structure may vary depending on a desired design of a three-dimensional semiconductor memory device.

The dummy plug DPLG may be provided in the cell contact region EXR as well as the cell array region CAR. The dummy plug DPLG may be provided to penetrate the sixth insulating layer 90 and the third insulating layer 50. A top surface of the dummy plug DPLG may be coplanar with the top surface of the sixth insulating layer 90 and the top surface of the second substrate 100. A bottom surface of the dummy plug DPLG may be coplanar with the bottom surface of the third insulating layer 50. The dummy plug DPLG may be spaced apart from the stack ST in the first or second direction D1 or D2.

The contact pad CPAD may be provided in an upper portion of the second insulating layer 40 and may be overlapped by the dummy plug DPLG. The second insulating layer 40 may not cover the top surface of the contact pad CPAD. The dummy plug DPLG may be in contact with the contact pad CPAD and may be connected to the contact pad CPAD. The contact pad CPAD may be formed of or include at least one of conductive materials (e.g., metallic materials and/or doped polysilicon).

The contact pad CPAD may be connected to at least one of the second bonding pads 45 through the connection contact plugs 41 and the connection circuit interconnection lines 43. At least one of the first bonding pads 35 may be connected to the second bonding pads 45, which are connected to the contact pad CPAD. The dummy plug DPLG may be connected to at least one of the first bonding pads 35 and at least one of the second bonding pads 45 through the contact pad CPAD. The first bonding pads 35, which are connected to the dummy plug DPLG, may be connected to each other through the peripheral contact plugs 31 and the peripheral circuit interconnection lines 33. The second bonding pads 45, which are connected to the dummy plug DPLG, may be connected to each other through the connection contact plugs 41 and the connection circuit interconnection lines 43.

On the cell array region CAR, a third vertical channel structure VS3 may be provided between the first vertical channel structures VS1. The third vertical channel structure VS3 may be configured to have substantially the same structure as each of the first vertical channel structures VS1. The third vertical channel structure VS3 may be connected to the second bonding pad 45, which is connected to the dummy plug DPLG, through the bit line contact plug BLCP, the bit lines BL, the connection contact plugs 41, and the connection circuit interconnection lines 43. Here, the third vertical channel structure VS3 may serve as a dummy vertical channel structure. The third vertical channel structure VS3 may be electrically connected to the first source conductive pattern SCP1 or the second substrate 100.

The first bonding pads 35, which are connected to the dummy plug DPLG, may not be connected to the first substrate 10. At least one of the second bonding pads 45, which are connected to the dummy plug DPLG, may be connected to the third vertical channel structure VS3 through the connection contact plugs 41 and the connection circuit interconnection lines 43. The dummy plug DPLG may be connected to the third vertical channel structure VS3 through the contact pad CPAD, the connection contact plugs 41, the connection circuit interconnection lines 43, the second bonding pads 45, the first bonding pads 35, the peripheral contact plugs 31, the peripheral circuit interconnection lines 33, the bit lines BL, and the bit line contact plug BLCP. In other words, the dummy plug DPLG may be grounded to the first source conductive pattern SCP1 or the second substrate 100. Thus, there may be only one electrical path that is connected from the dummy plug DPLG to the third vertical channel structure VS3.

As described above, according to various example embodiments, the dummy plug may be connected to first and second bonding pads, which are used to bond the peripheral circuit structure to the cell array structure, but it may be connected to one of the first substrate, the second substrate, or the vertical channel structure. Thus, by performing an electron beam inspection on the dummy plug, it may be possible to find an inner defect (e.g., a crack), which may occur in the first and second bonding pads, early or earlier in the middle of the process of fabricating the three-dimensional semiconductor memory device. For example, a three-dimensional semiconductor memory device with the inner defect may be sorted and excluded during the fabrication process, and thus, the electrical and/or reliability characteristics of the three-dimensional semiconductor memory device may be improved.

Any of the elements and/or functional blocks disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. The processing circuitry may include electrical components such as at least one of transistors, resistors, capacitors, etc. The processing circuitry may include electrical components such as logic gates including at least one of AND gates, OR gates, NAND gates, NOT gates, etc.

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Moreover, when the words "generally" and "substantially" are used in connection with material composition, it is intended that exactitude of the material is not required but that latitude for the material is within the scope of the disclosure.

Further, regardless of whether numerical values or shapes are modified as "about" or "substantially," it will be understood that these values and shapes should be construed as including a manufacturing or operational tolerance (e.g., ±10%) around the stated numerical values or shapes. Thus, while the term "same," "identical," or "equal" is used in description of example embodiments, it should be understood that some imprecisions may exist. Thus, when one element or one numerical value is referred to as being the same as another element or equal to another numerical value, it should be understood that an element or a numerical value is the same as another element or another numerical value within a desired manufacturing or operational tolerance range (e.g., ±10%).

While various example embodiments have been particularly shown and described, it will be understood by one of ordinary skill in the art that variations in form and detail may be made therein without departing from the spirit and scope of the attached claims. Furthermore example embodiments are not necessarily mutually exclusive with one another. For example, some example embodiments may include one or more features described with reference to one or more drawings, and may also include one or more other features described with reference to one or more other drawings.

What is claimed is:

1. A three-dimensional semiconductor memory device, comprising:

a first substrate;

a peripheral circuit structure on the first substrate, the peripheral circuit structure comprising a first bonding pad in an upper portion of the peripheral circuit structure; and a cell array structure on the peripheral circuit structure, wherein the cell array structure comprises, a second substrate, a stack interposed between the peripheral circuit structure and the second substrate, the stack comprising interlayer insulating layers and gate electrodes alternatingly stacked on the peripheral circuit structure, a first insulating layer enclosing the stack, a dummy plug penetrating the first insulating layer, a second insulating layer on the dummy plug, and a second bonding pad interposed between the stack and the peripheral circuit structure and connected to the dummy plug, wherein the first bonding pad is in contact with the second bonding pad, the dummy plug is connected to the second bonding pad, and a top surface of the dummy plug is in contact with the second insulating layer.

2. The semiconductor memory device of claim 1, wherein the first bonding pad is grounded to the first substrate.

3. The semiconductor memory device of claim 2, wherein the peripheral circuit structure further comprises peripheral contact plugs, peripheral circuit interconnection lines, and a third bonding pad in the upper portion of the peripheral circuit structure and spaced apart from the first bonding pad, and the first bonding pad and the third bonding pad are connected to each other by the peripheral contact plugs and peripheral circuit interconnection lines.

4. The semiconductor memory device of claim 3, wherein the cell array structure further comprises a fourth bonding pad between the stack and the peripheral circuit structure and spaced apart from the second bonding pad, and the third bonding pad is in contact with the second bonding pad.

5. The semiconductor memory device of claim 2, wherein the cell array structure further comprises a penetration contact plug that penetrates the first insulating layer and is spaced apart from the dummy plug in a first direction parallel to a top surface of the first substrate, and the cell array structure includes an input/output pad on the penetration contact plug, and the input/output pad is spaced apart from the dummy plug.

6. The semiconductor memory device of claim 5, wherein the dummy plug is connected to the first substrate through only one electrical path.

7. The semiconductor memory device of claim 1, wherein the cell array structure further comprises a substrate contact plug that penetrates the first insulating layer and is connected to the second substrate, and the dummy plug and the substrate contact plug are spaced apart from each other in a first direction parallel to a top surface of the first substrate.

8. The semiconductor memory device of claim 1, wherein the cell array structure further comprises, first vertical channel structures penetrating the stack, second vertical channel structures penetrating the stack and the first insulating layer, and a cell contact plug penetrating the first insulating layer and in contact with at least one of the gate electrodes, wherein the first and second vertical channel structures further penetrate a portion of the second substrate.

9. The semiconductor memory device of claim 8, wherein the cell array structure further comprises, a source structure interposed between the second substrate and the stack, and a dummy insulating pattern interposed between the second substrate and the stack and on a side surface of the source structure, wherein the first vertical channel structures comprise a vertical semiconductor pattern in contact with the source structure.

10. The semiconductor memory device of claim 1, wherein the peripheral circuit structure further comprises peripheral transistors, the peripheral transistors comprise peripheral source/drain regions electrically connected to the first substrate, and the first bonding pad is electrically connected to the peripheral source/drain region.

11. A three-dimensional semiconductor memory device, comprising:

a first substrate;

a peripheral circuit structure on the first substrate; and a cell array structure on the peripheral circuit structure, wherein the cell array structure comprises,
a second substrate,
a stack interposed between the peripheral circuit structure and the second substrate, the stack comprising interlayer insulating layers and gate electrodes alternatingly stacked on the peripheral circuit structure,
a first insulating layer enclosing the stack,
a second insulating layer on the first insulating layer,
an input/output pad penetrating the second insulating layer,
a dummy plug, a penetration contact plug, and a substrate contact plug, which penetrate the first insulating layer and are spaced apart from the stack in a first direction parallel to a top surface of the first substrate, and
connection contact plugs and connection circuit interconnection lines between the dummy plug and the peripheral circuit structure and between the substrate contact plug and the peripheral circuit structure,
wherein the substrate contact plug is in contact with the second substrate,
the input/output pad vertically overlaps with the penetration contact plug, and
the second insulating layer vertically overlaps with the dummy plug.

12. The semiconductor memory device of claim 11, wherein
the dummy plug and the substrate contact plug are electrically connected to each other through the connection contact plugs and the connection circuit interconnection lines,
the peripheral circuit structure comprises a plurality of first bonding pads in an upper portion of the peripheral circuit structure,
the cell array structure further comprises a second bonding pad that extends in the first direction to be in contact with the plurality of first bonding pads, and
the dummy plug and the substrate contact plug are connected to the second bonding pad.

13. The semiconductor memory device of claim 12, wherein
the second insulating layer covers the connection contact plugs, the connection circuit interconnection lines, and the second bonding pad, and
a bottom surface of the second bonding pad is exposed from the second insulating layer.

14. The semiconductor memory device of claim 12, wherein
the peripheral circuit structure further comprises peripheral contact plugs and peripheral circuit interconnection lines connected to the peripheral contact plugs, and
the plurality of first bonding pads are spaced apart from the peripheral contact plugs and the peripheral circuit interconnection lines.

15. The semiconductor memory device of claim 11, wherein
the dummy plug and the substrate contact plug are connected to each other through the connection contact plugs and the connection circuit interconnection lines,
the peripheral circuit structure comprises a plurality of first bonding pads in an upper portion of the peripheral circuit structure,
the cell array structure comprises a plurality of second bonding pads in contact with the plurality of first bonding pads, respectively, and the connection contact plugs and
the connection circuit interconnection lines are spaced apart from the plurality of first bonding pads and the plurality of second bonding pads.

16. The semiconductor memory device of claim 11, wherein
the cell array structure further comprises,
a cell contact plug to penetrate the first insulating layer and to be in contact with
at least one of the gate electrodes,
a first conductive line connected to the cell contact plug,
a second conductive line connected to the substrate contact plug, and
a third conductive line connected to the dummy plug,
wherein the first to third conductive lines extend in a second direction parallel to the top surface of the first substrate and crossing the first direction, and
the first conductive line is electrically disconnected from the second conductive line and the third conductive line.

17. The semiconductor memory device of claim 11, wherein a top surface of the dummy plug is located at substantially the same level as a top surface of the penetration contact plug.

18. An electronic system, comprising:
a three-dimensional semiconductor memory device including a first substrate, a peripheral circuit structure on the first substrate, a cell array structure on the peripheral circuit structure, a first insulating layer covering the cell array structure, and an input/output pad on the first insulating layer and electrically connected to the peripheral circuit structure; and
a controller, which is electrically connected to the three-dimensional semiconductor memory device through the input/output pad and is configured to control the three-dimensional semiconductor memory device,
wherein the peripheral circuit structure comprises,
first bonding pads in an upper portion of the peripheral circuit structure, and
peripheral contact plugs and peripheral circuit interconnection lines connected to the first bonding pads,
wherein the cell array structure comprises,
a second substrate on the peripheral circuit structure,
a stack interposed between the peripheral circuit structure and the second substrate, the stack comprising interlayer insulating layers and gate electrodes which are alternately stacked,
a dummy plug spaced apart from the stack and extending in a direction perpendicular to a top surface of the first substrate,
a second insulating layer on the dummy plug,
connection contact plugs and connection circuit interconnection lines interposed between the peripheral circuit structure and the dummy plug, and
second bonding pads in contact with the first bonding pads,
wherein a top surface of the dummy plug is in contact with the second insulating layer, and
the input/output pad is spaced apart from the dummy plug.

19. The electronic system of claim 18, wherein
the cell array structure further comprises a third insulating layer penetrating the stack,
the dummy plug penetrates the third insulating layer,
the second bonding pads are electrically connected to the dummy plug,
at least one of the first bonding pads is grounded to the first substrate, and the second bonding pads are connected to each other through the connection contact plugs and the connection circuit interconnection lines.

20. The electronic system of claim 18, wherein the cell array structure further comprises, a third insulating layer penetrating the stack, and first vertical channel structures and a second vertical channel structure penetrating the stack, the dummy plug penetrates the third insulating layer, the second bonding pads are electrically connected to the dummy plug, at least one of the second bonding pads is electrically connected to the second vertical channel structure, and the second bonding pads are electrically disconnected from the first vertical channel structures.

* * * * *